(12) United States Patent
Nara

(10) Patent No.: US 8,541,692 B2
(45) Date of Patent: Sep. 24, 2013

(54) PRINTED WIRING BOARD

(75) Inventor: Shigeo Nara, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 325 days.

(21) Appl. No.: 12/432,122

(22) Filed: Apr. 29, 2009

(65) Prior Publication Data
US 2010/0155127 A1 Jun. 24, 2010

(30) Foreign Application Priority Data
Dec. 22, 2008 (JP) .................... 2008-325707

(51) Int. Cl.
*H05K 1/11* (2006.01)
*H05K 1/03* (2006.01)

(52) U.S. Cl.
USPC .......................... 174/261; 174/255

(58) Field of Classification Search
None
See application file for complete search history.

(56) References Cited

U.S. PATENT DOCUMENTS

| | | | |
|---|---|---|---|
| 6,538,621 B1 * | 3/2003 | Sievenpiper et al. | 343/909 |
| 7,438,560 B2 | 10/2008 | Takahashi | |
| 7,505,285 B2 | 3/2009 | Osaka | |
| 2009/0038840 A1 * | 2/2009 | Kim et al. | 174/376 |
| 2009/0084582 A1 * | 4/2009 | Kim et al. | 174/250 |

FOREIGN PATENT DOCUMENTS

| | | |
|---|---|---|
| JP | A-2002-258117 | 9/2002 |
| JP | A 2006-302986 | 11/2006 |
| JP | A 2008-99249 | 4/2008 |

OTHER PUBLICATIONS

Japanese Office Action issued in Japanese Application No. 2008-325707 on Sep. 14, 2010 (with translation).

* cited by examiner

*Primary Examiner* — Jayprakash N Gandhi
*Assistant Examiner* — Dion Ferguson
(74) *Attorney, Agent, or Firm* — Oliff & Berridge, PLC

(57) ABSTRACT

There is provided a printed wiring board, including: plural first conductive patterns arranged adjacently in a first direction and separated by first gaps; plural conductive pattern rows comprising the plural first conductive patterns, adjacent conductive pattern rows being offset from each other in the first direction by a second gap; a conductive pattern group comprising the plural conductive pattern rows arranged adjacently in a second direction that intersects the first direction and separated by third gaps; plural second conductive patterns that are smaller than the first conductive patterns and that connect, in the first direction, each of the plural first conductive patterns to first conductive patterns adjacent thereto in the first direction; and plural third conductive patterns that are smaller than the first conductive patterns, and that connect, in the second direction, each of the plural first conductive patterns to first conductive patterns adjacent thereto in the second direction.

5 Claims, 24 Drawing Sheets

US 8,541,692 B2

PRINTED WIRING BOARD

CROSS-REFERENCE TO RELATED APPLICATION

This application is based on and claims priority under 35 USC 119 from Japanese Patent Application No. 2008-325707 filed on Dec. 22, 2008.

BACKGROUND

1. Technical Field

The present invention relates to a printed wiring board.

2. Related Art

In a printed wiring board in which two different circuits are provided, a signal generated by one circuit propagates as noise to the other circuit, which may deteriorate the characteristics of the other circuit. To avoid this, an EBG (Electromagnetic Band Gap) pattern, in which two conductive patterns of different sizes are combined, is provided between the above two circuits in a power supply layer of the printed wiring board to suppress propagation of a signal generated by one circuit as noise to another circuit.

The present invention provides a printed wiring board that can suppress an increase in transmission amount of a signal that propagates at a layer unrelated to signal transfer between circuits, and can reduce emission of electromagnetic waves caused by the signal.

SUMMARY

According to an aspect of the invention, there is provided a printed wiring board, including:

plural first conductive patterns arranged adjacently in a first direction and separated by first gaps;

plural conductive pattern rows comprising the plural first conductive patterns, adjacent conductive pattern rows being offset from each other in the first direction by a second gap;

a conductive pattern group comprising the plural conductive pattern rows arranged adjacently in a second direction that intersects the first direction and separated by third gaps;

plural second conductive patterns that are smaller than the first conductive patterns and that connect, in the first direction, each of the plural first conductive patterns to first conductive patterns adjacent thereto in the first direction; and plural third conductive patterns that are smaller than the first conductive patterns, and that connect, in the second direction, each of the plural first conductive patterns to first conductive patterns adjacent thereto in the second direction.

BRIEF DESCRIPTION OF THE DRAWINGS

Exemplary embodiments of the present invention will be described in detail based on the following figures, wherein.

DETAILED DESCRIPTION

Embodiments of the invention will be explained below with reference to the drawings. Further, the embodiments of the invention will be explained with respect to a case in which the printed wiring board of the invention is applied to a motherboard in which plural circuit boards are connected via a connector and that supplies power to the connected plural circuit boards.

First Embodiment

Figure 1:
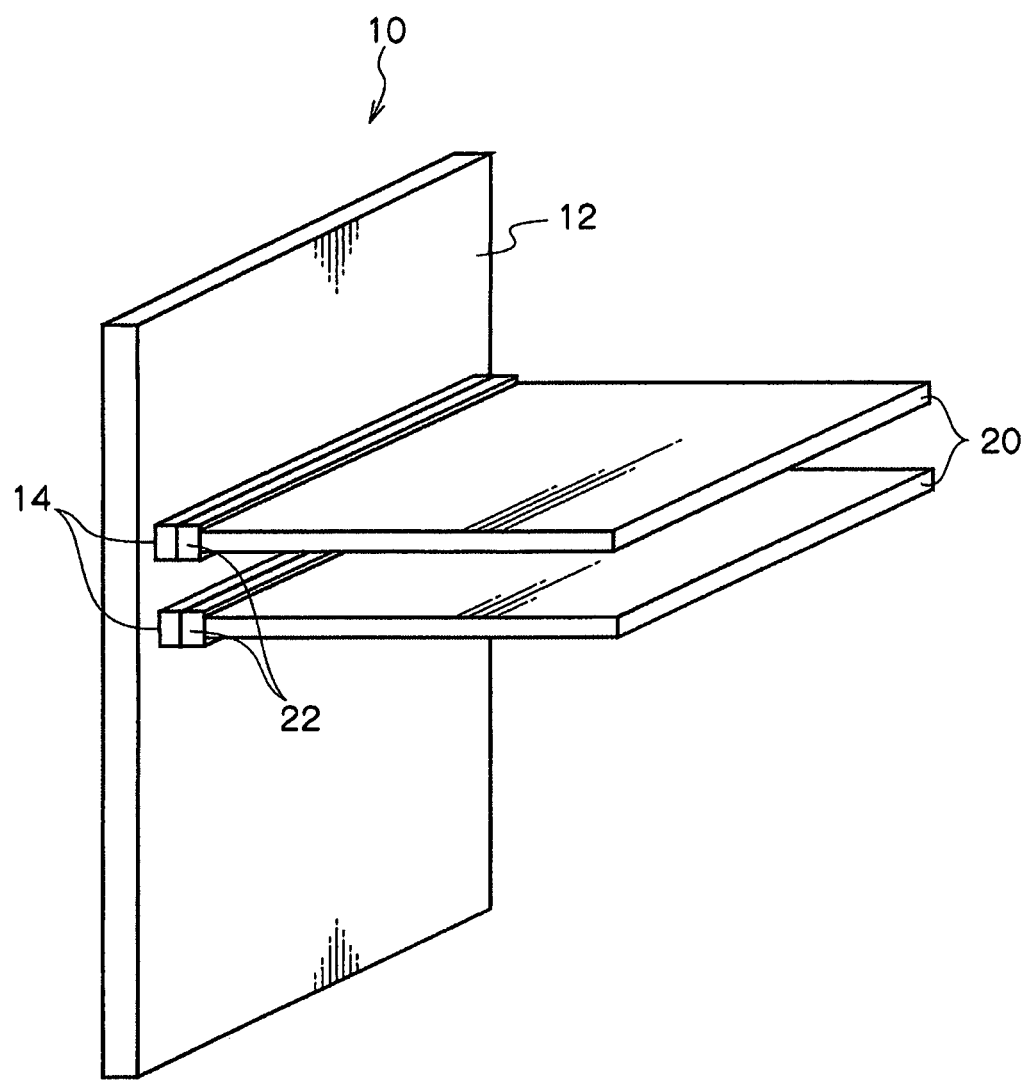
FIG. 1 is an outer view showing an outer view configuration of a motherboard according to an embodiment of the invention.

The outer structure of motherboard 10 according to the present embodiment will be explained below with reference to FIG. 1.

Motherboard 10 is provided with board 12 and plural connectors 14.

Board 12 includes a signal layer, a power supply layer, and a ground layer, which are laminated with an insulation layer between each layer.

Connectors 14 are electrically and mechanically connectable to connectors 22 provided to circuit boards 20 which have predetermined functions. Motherboard 10 of the present embodiment has two connectors 14, but may have more than two.

When connectors 22 of circuit boards 20 are electrically and mechanically connected to connectors 14, they are supplied with power from a power supply portion via a power supply layer of board 12, and are connected to ground via a ground layer. Further, one circuit board 20 can send and receive signals to and from another circuit board 20 electrically and mechanically connected to another connector 14, via a signal layer.

However, when multiple circuit boards 20 are connected to motherboard 10 via connectors 14, a signal generated at one circuit board 20 may cause noise to be generated with respect to a signal generated at another circuit board 20.

Figure 2A:
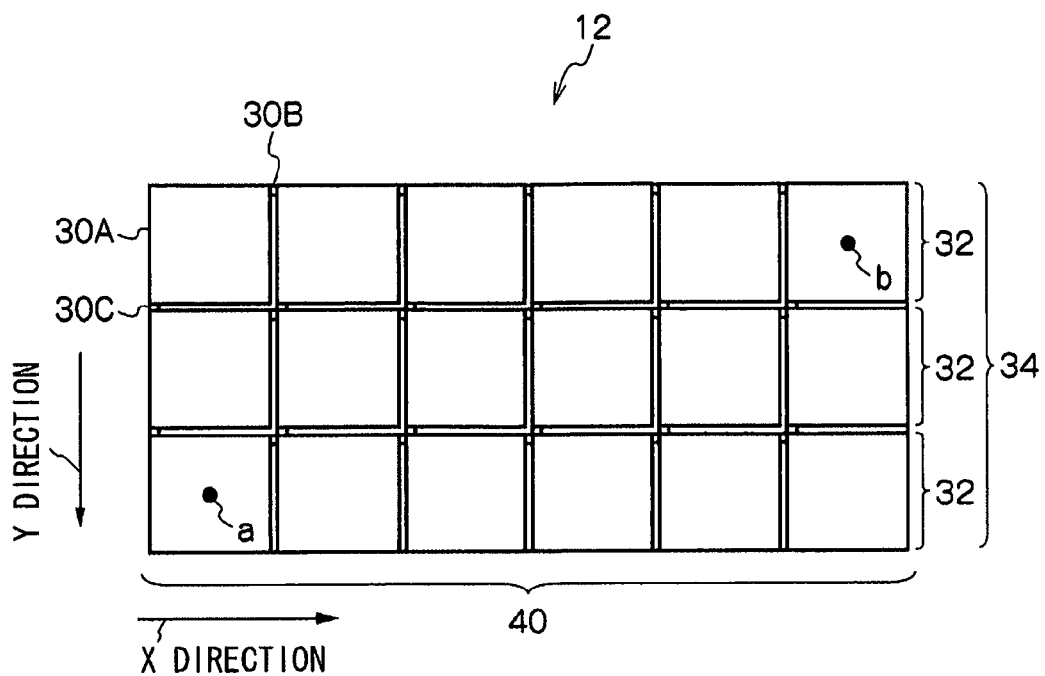
FIG. 2A is a schematic view showing the structure of a conventional EBG pattern.

Conventionally, to reduce this noise, an EBG pattern has been used which includes, as shown in FIG. 2, and as power supply wiring in a power supply layer, plural conductive pattern rows 32, each including plural conductive patterns 30A arranged adjacently in an x direction separated by gaps, plural conductive pattern rows 32 being arranged in a y direction perpendicular to the x direction and separated by gaps to form a conductive pattern group 34; plural conductive patterns 30B, which are smaller than conductive patterns 30A and which connect in an x direction respective conductive patterns 30A which are adjacent in an x direction; and plural conductive patterns 30C which are smaller than conductive patterns 30A and which connect in a y direction respective conductive patterns 30A which are adjacent in a y direction (hereinafter referred to as a "conventional EBG pattern"). Conductive patterns 30A in the conventional EBG pattern 40 shown in FIG. 2A have a square shape.

Figure 2B:
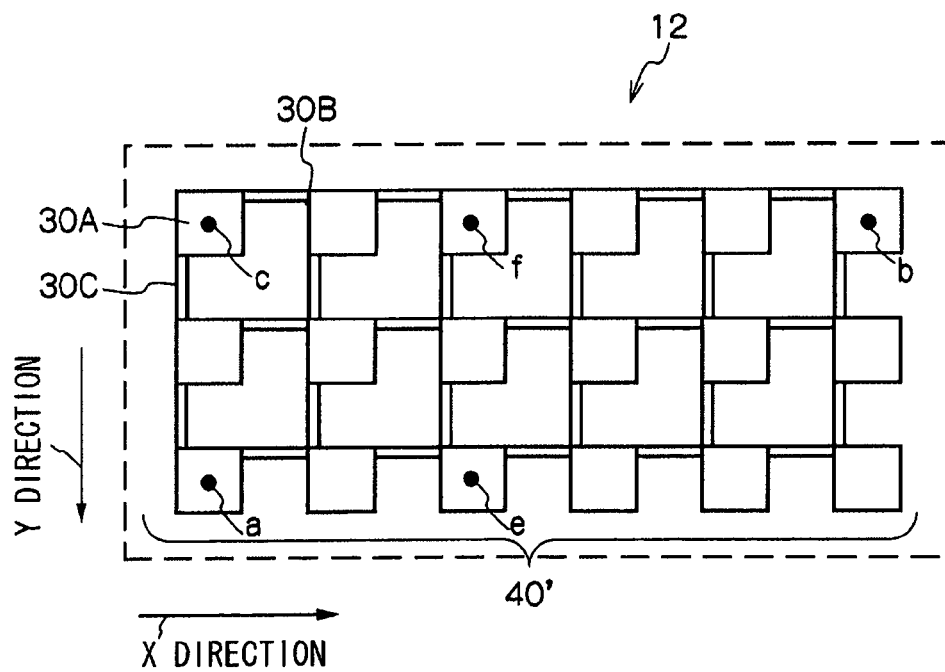
FIG. 2B is a schematic view showing the structure of a conventional EBG pattern.

In contrast with conductive patterns 30A shown in FIG. 2A, the EBG pattern for power supply wiring shown in FIG. 2B is a conventional EBG wiring 40' including plural conductive patterns 30A having shorter sides, conductive patterns 30B, and conductive patterns 30C.

By shortening the sides of conductive patterns 30A that form the EBG pattern, emission of electromagnetic waves due to propagation of signals in the power supply layer is reduced, and thereby electromagnetic interference (EMI) may be suppressed. However, the transmission amount of a signal that propagates in the power supply layer (hereinafter referred to as "S21") increases (see FIGS. 4A and 4B).

Figure 3:
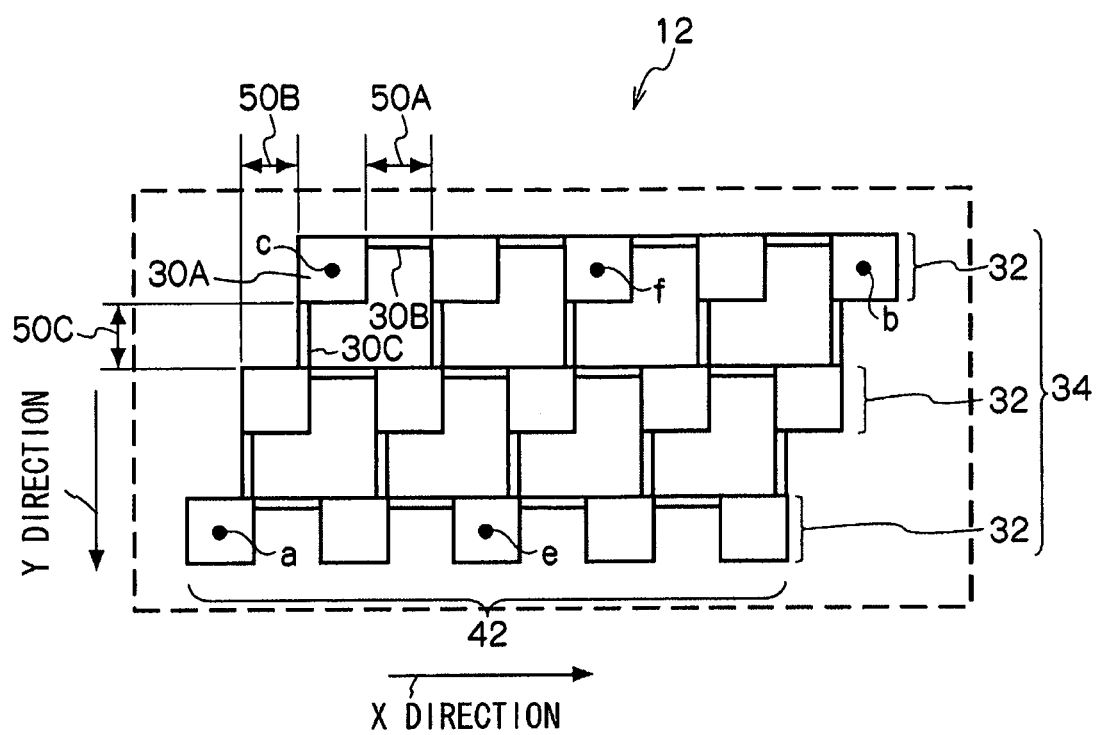
FIG. 3 is a schematic view showing the structure of a shifted EBG pattern according to an embodiment of the invention.

As shown in FIG. 3, motherboard 10 according to the present embodiment uses, as power supply wiring in a power supply layer, an EBG pattern including conductive pattern rows 32, each including plural conductive patterns 30A arranged adjacently in an x direction separated by gaps 50A, at least one of the plural conductive pattern rows 32 being shifted by a gap 50B in an x direction, the conductive pattern rows 32 being arranged adjacently in a y direction separated by gaps 50C to form a conductive pattern group 34; plural conductive patterns 30B which connect in an x direction conductive patterns 30A which are adjacent in an x direction; and plural conductive patterns 30C which connect in a y direction conductive patterns 30A which are adjacent in a y direction (hereinafter referred to as a "shifted EBG pattern").

In shifted EBG pattern 42 according to the present embodiment, a conductive pattern 30A is connected via a conductive pattern 30B to another conductive pattern 30A adjacent thereto in the x direction, at a right side portion of a top side thereof as seen in FIG. 3, and connected via a conductive pattern 30C to another conductive pattern 30A adjacent thereto in the y direction, at a left edge portion of a bottom side thereof as seen in as seen in FIG. 3.

In shifted EBG pattern 42 according to the present embodiment, the shape of conductive pattern 30A is a square, one side of which faces in the x direction; the lengths of each of gap 50A and gap 50B are substantially equal to the lengths of the sides of conductive pattern 30A, and conductive pattern 30B is a rectangular shape having a length that is substantially equal to the length of the sides of conductive pattern 30A. As a result, conductive patterns 30A of adjacent conductive pattern rows 32 do not oppose each other in the y direction, and parasitic capacitance generated when conductive patterns 30A oppose each other is reduced.

In shifted EBG pattern 42 according to the present embodiment, gap 50C also has a length that is substantially equal to a side of conductive pattern 30A, and conductive pattern 30C has a rectangular shape with a length that is substantially equal to a lengths of a side of conductive pattern 30A.

Figure 4A:
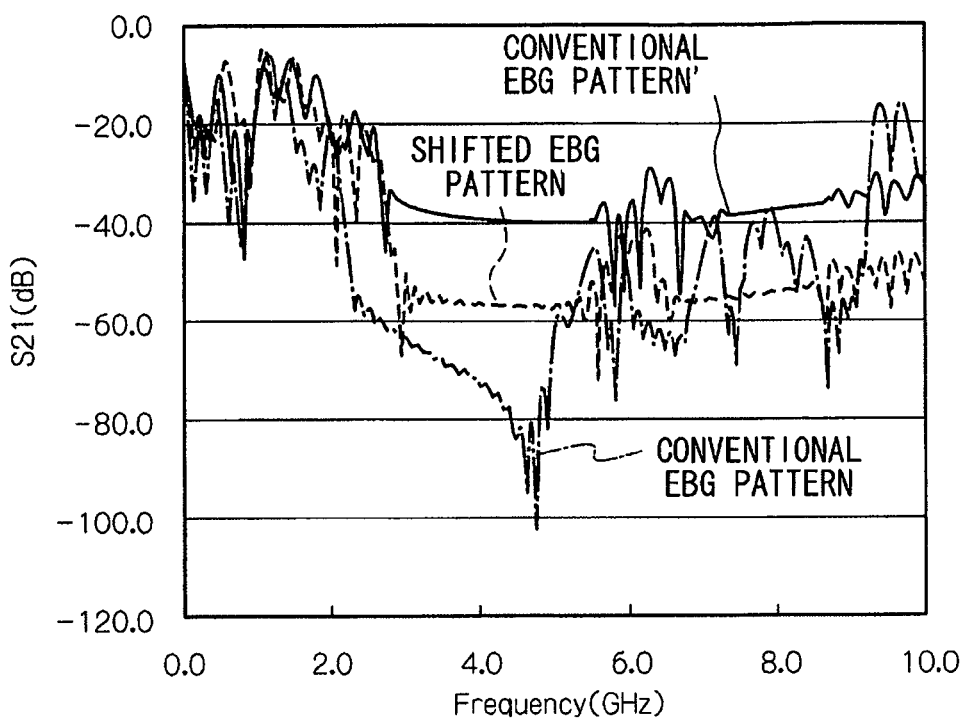
FIG. 4A is a graph showing an example of a measurement result of a variation in S21 with respect to frequency when a signal is propagated, for a shifted EBG pattern according to an embodiment of the invention and conventional EBG patterns.
Figure 4B:
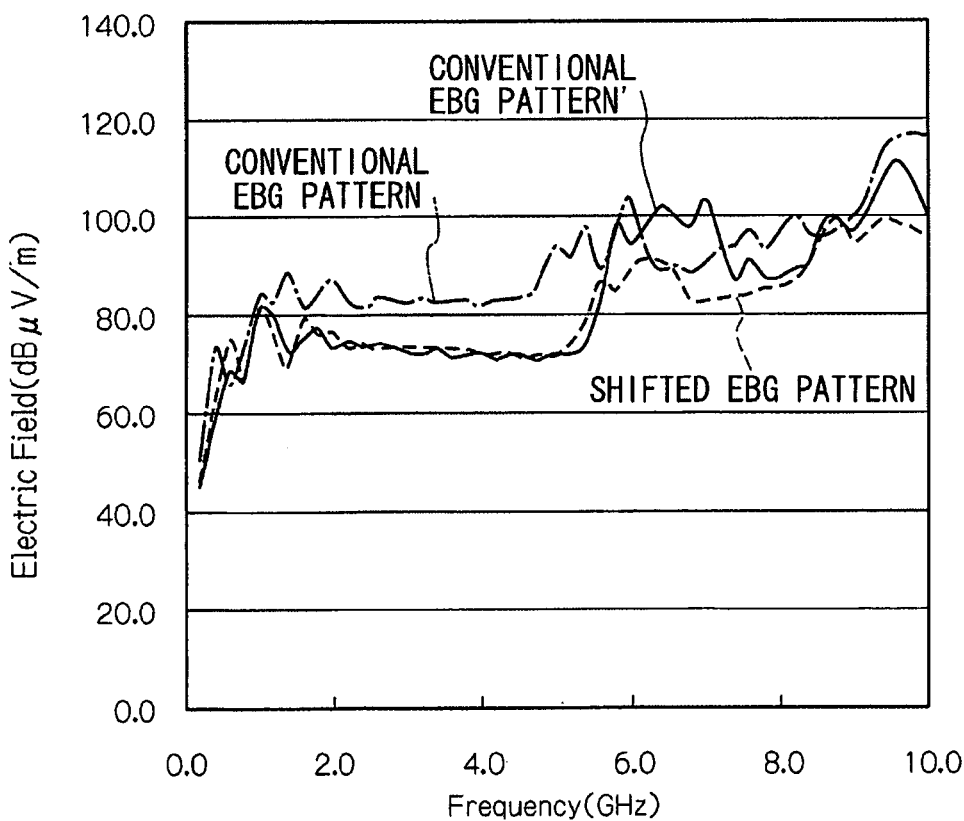
FIG. 4B is a graph showing an example of a measurement result of a variation in emitted electric field strength with respect to frequency when a signal is propagated, for a shifted EBG pattern according to an embodiment of the invention and conventional EBG patterns.

FIG. 4A shows an example of a measurement result of a variation in S21 with respect to frequency, when a signal propagates from measurement point a to measurement point b, and FIG. 4B shows an example of a measurement result of a variation in emitted electric field strength with respect to frequency when a signal propagates from measurement point a to measurement point b, for each of shifted EBG pattern 42 shown in FIG. 3 and conventional EBG patterns 40 and 40' shown in FIG. 2.

In the following explanation, board 12, which is used to measure the change in S21 and emitted electric field strength with respect to frequency when a signal propagates in an EBG pattern, is provided with connectors 14, and an EBG pattern including conductive patterns 30A, 30B, and 30C, and is not provided with other patterns such as signal wiring.

The measurement results shown in FIG. 4A and FIG. 4B are measured with respect to, for example, conventional EBG patterns 40 and 40' shown in FIG. 2A and FIG. 2B, in which three conductive pattern rows 32 are arranged adjacently in the y direction, each including conductive patterns 30A arranged in rows of six in the x direction, and a shifted EBG pattern 42 as shown in FIG. 3, in which three conductive pattern rows 32 are arranged adjacently in the y direction separated by gaps 50C, each including conductive patterns 30A arranged in rows of five in the x direction.

Conductive pattern 30A of conventional EBG pattern 40 in the present measurement has a square shape with sides of length 15 mm. Conductive pattern 30B and conductive pattern 30C are 0.5 mm long at the sides that do not contact a conductive pattern 30A (hereinafter referred to simply as "length"), and 1 mm long at the sides that contact a conductive pattern 30A (hereinafter referred to simply as "width"). Conductive pattern 30A of conventional EBG pattern 40' in the present measurement has a square shape with sides of length 8 mm. Conductive pattern 30B and conductive pattern 30C are rectangular shapes 7.5 mm long and 1 mm wide.

Conductive pattern 30A of shifted EBG pattern 42 in the present measurement has a square shape with sides of length 8 mm. Conductive pattern 30B and conductive pattern 30C are rectangular shapes 7.5 mm long and 1 mm wide.

Board 12, on which conventional EBG patterns 40 and 40', and shifted EBG pattern 42 are formed, is a rectangular shape 92.5 mm long and 46 mm wide.

In FIGS. 4A and 4B, the dot-dash line represents a measurement result for conventional EBG pattern 40, the solid line represents a measurement result for conventional EBG pattern 40', and the dashed line represents a measurement result for shifted EBG pattern 42.

As shown in FIG. 4A, the value of S21 in conventional EBG pattern 40 is substantially lower than the other EBG patterns, and since the next lowest S21 value is that for shifted EBG pattern 42, the characteristics of shifted EBG pattern 42 with respect to S21 are better than those of conventional EBG pattern 40'.

On the other hand, as shown in FIG. 4B, the emitted electric field strength of shifted EBG pattern 42 is substantially lower than the other EBG patterns, and therefore the characteristics of shifted EBG pattern 42 with respect to emitted electric field strength are better than those of conventional EBG patterns 40 and 40'.

Next, with reference to FIGS. 5A and 5B, and in comparison with conventional EBG patterns 40 and 40' and shifted EBG pattern 42, which were measured to give the measurement results shown in FIGS. 4A and 4B, explanation will be given of the change in S21 and the change in emitted electric field strength with respect to frequency when a signal propagates for conventional EBG patterns 40 and 40' and shifted EBG pattern 42 in which the sizes of board 12 and conductive pattern 30A are reduced.

The board on which conventional EBG patterns 40 and 40' and shifted EBG pattern 42 which are the subject of the present measurement are formed has a rectangular shape 62.5 mm long and 30 mm wide.

In conventional EBG pattern 40 which is a subject of the present measurement, conductive pattern 30A has a square shape with sides of 10 mm, while conductive pattern 30C and conductive pattern 30B are each a rectangular shape 0.5 mm long and 1 mm wide. In conventional EBG pattern 40', conductive pattern 30A has a square shape with sides of 6 mm, while conductive pattern 30C and conductive pattern 30B each have a rectangular shape 4.5 mm long and 1 mm wide. In shifted EBG pattern 42, conductive pattern 30A of has a square shape with sides of 6 mm, while conductive pattern 30C and conductive pattern 30B each have a rectangular shape 4.5 mm long and 1 mm wide.

Figure 5A:
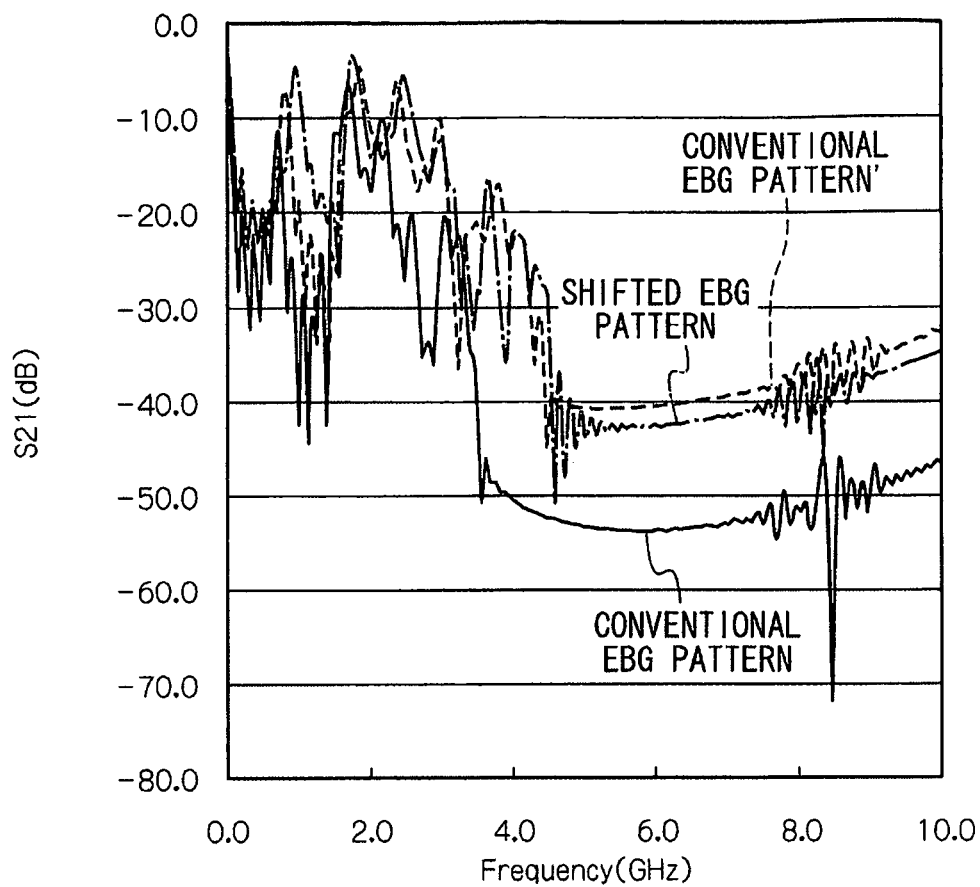
FIG. 5A is a graph showing an example of a measurement result of a variation in S21 with respect to frequency when a signal is propagated, for another shifted EBG pattern according to an embodiment of the invention and conventional EBG patterns.
Figure 5B:
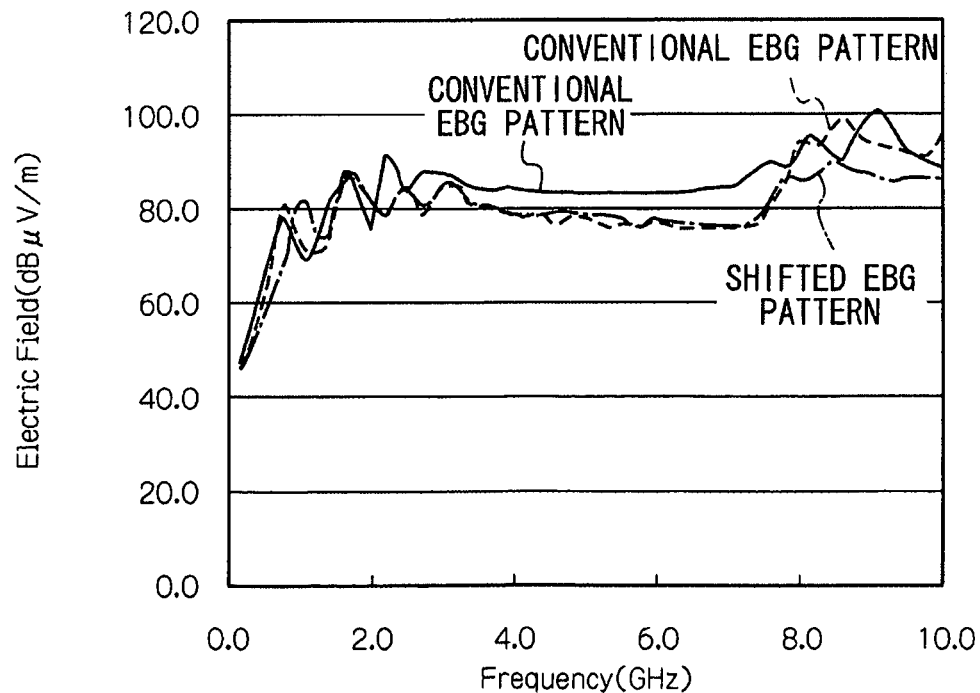
FIG. 5B is a graph showing an example of a measurement result of a variation in emitted electric field strength with respect to frequency when a signal is propagated, for another shifted EBG pattern according to an embodiment of the invention and conventional EBG patterns.

FIG. 5A shows an example of a variation in measurement result of S21 with respect to frequency when a signal propagates from measurement point a to measurement point b for each of conventional EBG pattern 40', conventional EBG pattern 40, and shifted EBG pattern 42. FIG. 5B shows an example of a variation in measurement result of emitted electric field strength with respect to frequency.

In FIG. 5, the solid line represents the measurement result for conventional EBG pattern 40, the dashed line represents the measurement result for conventional EBG pattern 40', and the dot-dash line represents the measurement result for shifted EBG pattern 42.

As shown in FIG. 5A, the value of S21 in conventional EBG pattern 40 is substantially lower than the other EBG patterns, and shifted EBG pattern 42 exhibits the next lowest value of S21. As shown in FIG. 5B, the value of emitted electric field strength in shifted EBG pattern 42 is lower than the other EBG patterns. From this it can be understood that even if the sizes of board 12 and conductive pattern 30A are varied, the variations in S21 characteristics and emitted electric field strength characteristics for each of conventional EBG patterns 40 and 40', and shifted EBG pattern 42 remain the same.

Next, with reference to FIGS. 6A and 6B, variations in S21 and emitted electric field strength with respect to frequency when a signal propagates from measurement point a to measurement point b, measured for two shifted EBG patterns 42 having different sizes of conductive pattern 30A, will be explained.

The two shifted EBG patterns 42 in the present measurement include three conductive pattern rows 32 arranged adjacently in the y direction, each row including five conductive patterns 30A arranged in the x direction, as shown in FIG. 3. Board 12 on which the shifted EBG patterns 42 are formed has a rectangular shape 95.5 mm long and 46 mm wide.

The conductive patterns 30A of one of the shifted EBG patterns 42 have a square shape with sides of 8 mm, and the conductive patterns 30B and 30C thereof have rectangular shapes 7.5 mm long and 1 mm wide. The conductive patterns 30A of the other shifted EBG pattern 42 have a square shape with sides of 7.5 mm, and the conductive patterns 30B and 30C thereof have rectangular shapes 8 mm long and 1 mm wide.

Figure 6A:
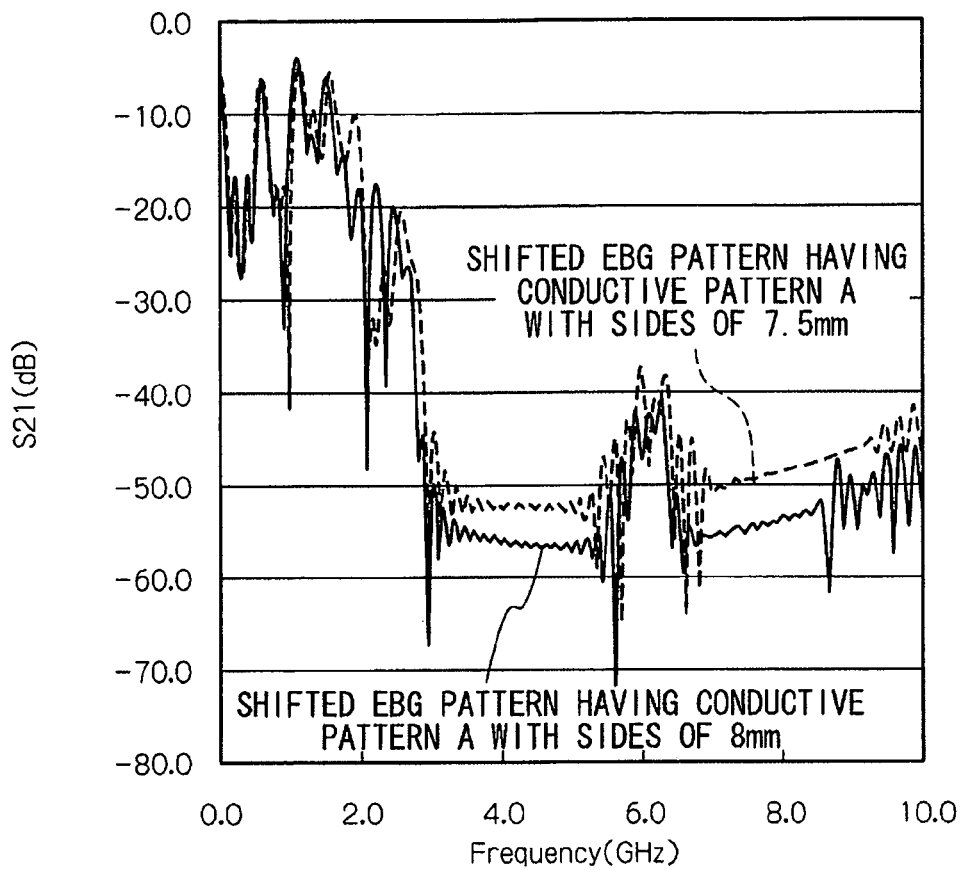
FIG. 6A is a graph showing an example of a measurement result of a variation in S21 with respect to frequency when a signal is propagated, for another shifted EBG pattern having conductive patterns with sides of 8 mm and in the shifted EBG pattern having conductive pattern with sides of 7.5 mm.
Figure 6B:
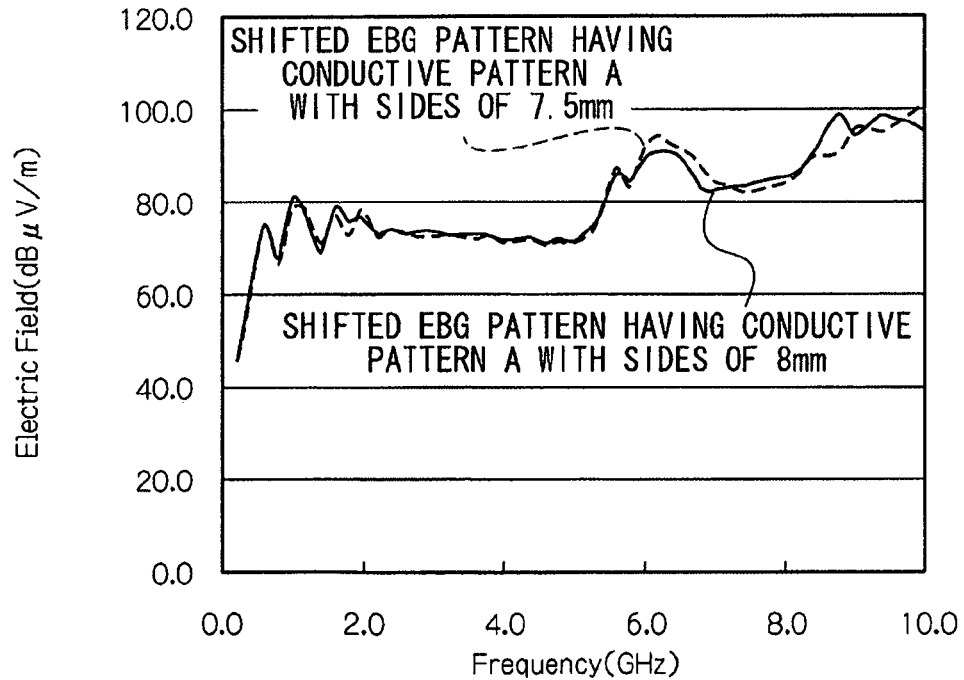
FIG. 6B is a graph showing an example of a measurement result of a variation in emitted electric field strength with respect to frequency when a signal is propagated, for the shifted EBG pattern having conductive patterns with sides of 8 mm and in the shifted EBG pattern having conductive pattern with sides of 7.5 mm.

FIG. 6A shows the change in measurement result of S21 with respect to frequency when a signal propagates from measurement point a to measurement point b, in the shifted EBG pattern 42 having conductive patterns 30A with sides of 8 mm and in the shifted EBG pattern 42 having conductive pattern 30A with sides of 7.5 mm, and FIG. 6B shows the respective variations in measurement result of emitted electric field strength thereof with respect to frequency.

In FIGS. 6A and 6B, the solid line represents the shifted EBG pattern 42 having conductive pattern 30A with sides of 8 mm, and the dashed line represents the shifted EBG pattern 42 having conductive pattern 30A with sides of 7.5 mm.

As shown in FIG. 6A, the S21 value for the shifted EBG pattern 42 having conductive pattern 30A with sides of 8 mm is substantially lower than that for the shifted EBG pattern 42 having conductive pattern 30A with sides of 7.5 mm.

However, as shown in FIG. 6B, the emitted electric field strength characteristics for the shifted EBG pattern 42 having conductive patterns 30A with sides of 8 mm are substantially similar to the emitted electric field strength characteristics for the shifted EBG pattern 42 having conductive pattern 30A with sides of 7.5 mm.

Next, with reference to FIGS. 7A-11B, the change in measurement result of S21 and emitted electric field strength with respect to frequency when a signal propagates, measured for each of a conventional EBG pattern 40' and a shifted EBG pattern 42, each having conductive patterns 30A with sides of 10 mm, and a conventional EBG pattern 40' and a shifted EBG pattern 42, each having conductive patterns 30A with sides of 8 mm, will be explained.

The structures of conventional EBG pattern 40' and shifted EBG pattern 42 having conductive patterns 30A with sides of 8 mm are the same as those shown in FIG. 2B and FIG. 3 respectively.

Figure 7A:
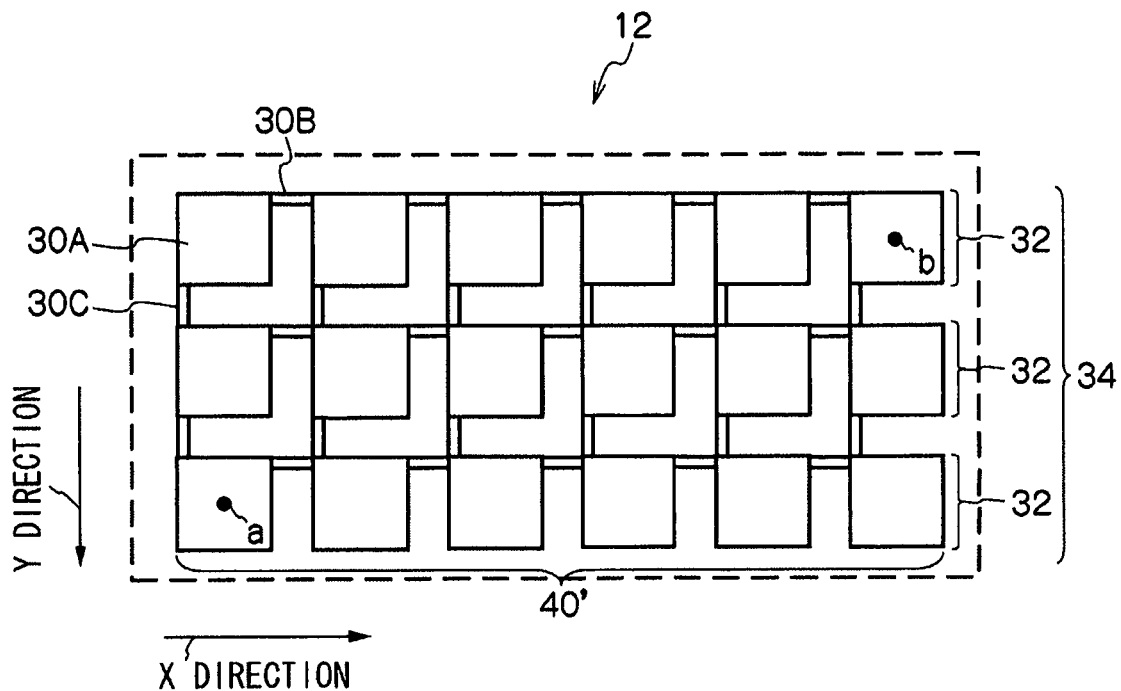
FIG. 7A is a schematic view showing a structure of a conventional EBG pattern in which conductive patterns 30A have sides of length 10 mm.
Figure 7B:
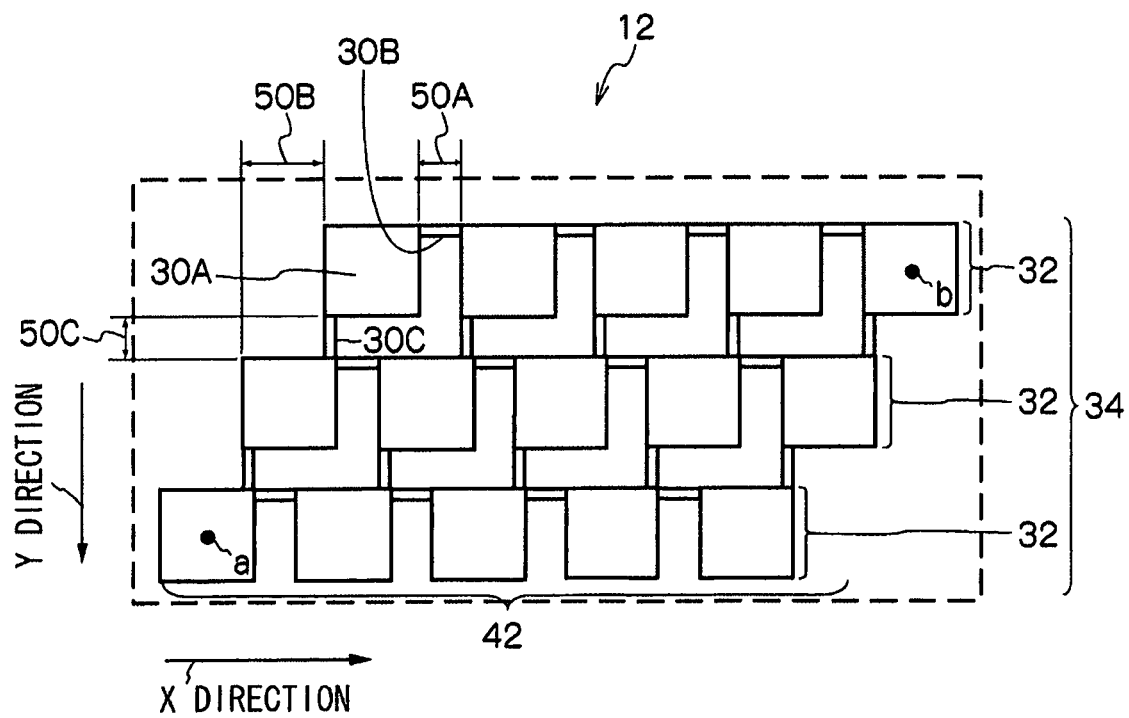
FIG. 7B is a schematic view showing a structure of a shifted EBG pattern in which conductive patterns 30A have sides of length 10 mm according to an embodiment of the invention.

FIGS. 7A and 7B show the structures of conventional EBG pattern 40' and shifted EBG pattern 42 having conductive patterns 30A with sides of 10 mm.

Conventional EBG pattern 40' includes three conductive pattern rows 32 adjacent in the y direction, each row including six conductive patterns 30A arranged in the x direction. Shifted EBG pattern 42 includes three conductive pattern rows 32 adjacent in the y direction, each row including five conductive patterns 30A arranged in the x direction. Board 12 has a rectangular shape 92.5 mm long and 46 mm wide.

Conductive patterns 30A of conventional EBG pattern 40' shown in FIG. 7A and shifted EBG pattern 42 shown in FIG. 7B have square shapes with sides of length 10 mm, and conductive patterns 30B and 30C have rectangular shapes 5.5 mm long and 1 mm wide.

The length of conductive patterns 30B of shifted EBG pattern 42 shown in FIG. 7B are not substantially equal to the length of the sides of conductive patterns 30A, and therefore, areas that oppose conductive patterns 30A adjacent in the y direction are larger than those of the shifted EBG pattern 42 shown in FIG. 7A.

Figure 8A:
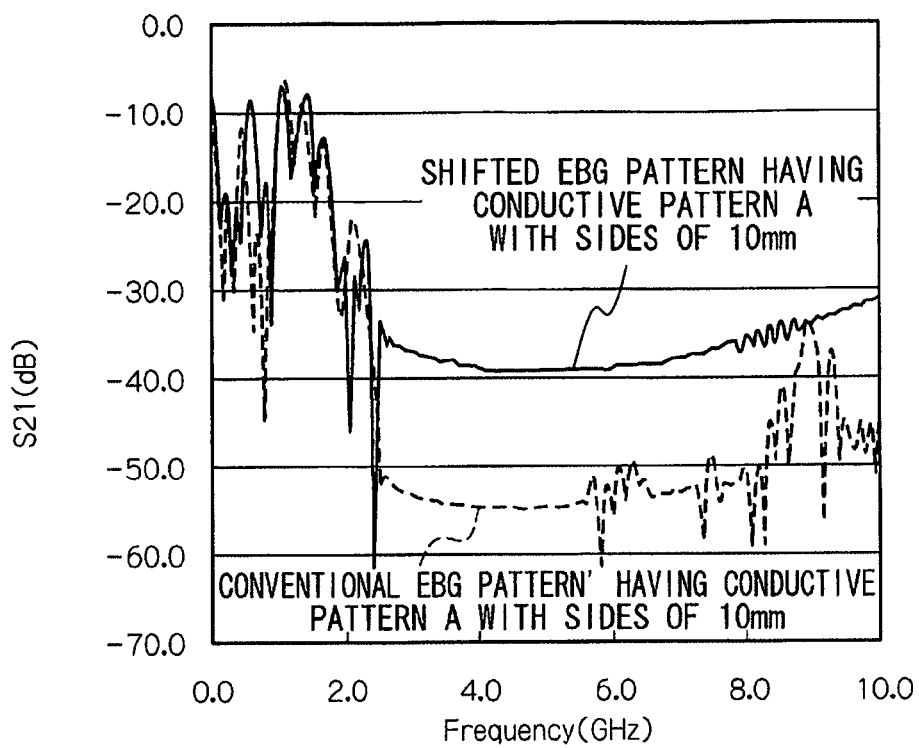
FIG. 8A is a graph showing an example of a measurement result of a variation in S21 with respect to frequency when a signal is propagated, for a conventional EBG pattern and a shifted EBG pattern, in which conductive patterns 30A have sides of length 10 mm.
Figure 8B:
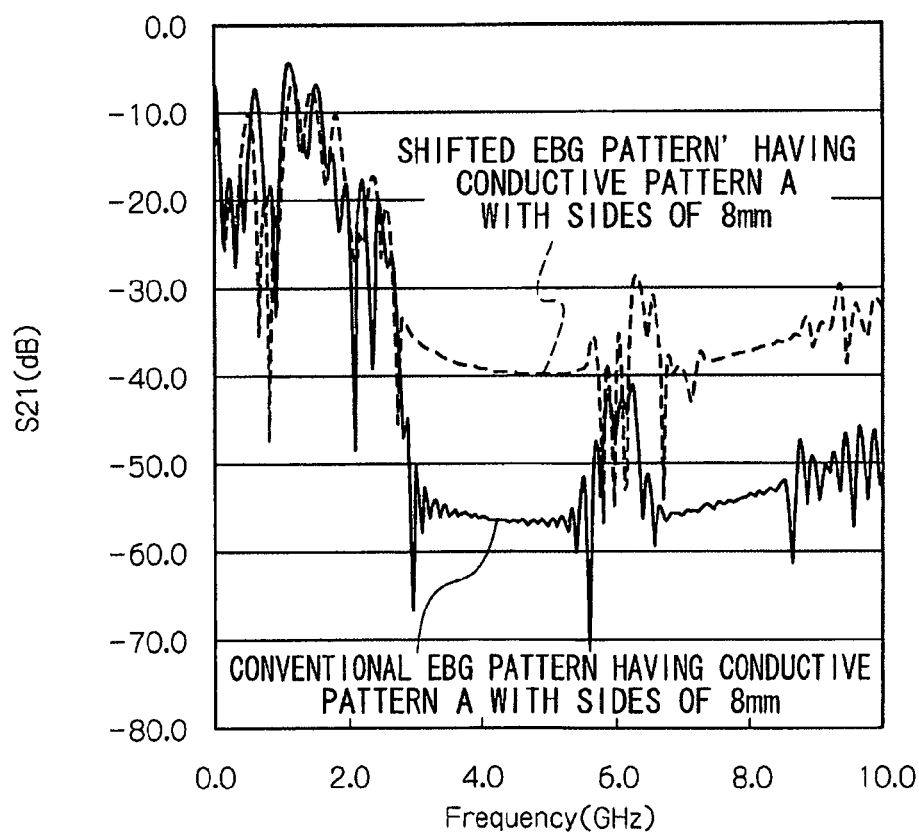
FIG. 8B is a graph showing an example of a measurement result of a variation in S21 with respect to frequency when a signal is propagated, for a conventional EBG pattern and a shifted EBG pattern, in which conductive patterns 30A have sides of length 8 mm.

FIG. 8A shows an example of a variation in measurement result of S21 with respect to frequency when a signal propagates from measurement point a to measurement point b for conventional EBG pattern 40' and shifted EBG pattern 42 having conductive patterns 30A with sides of 10 mm. FIG. 8B shows an example of a variation in measurement result of S21 with respect to frequency when a signal propagates from measurement point a to measurement point b for conventional EBG pattern 40' and shifted EBG pattern 42 having conductive patterns 30A with sides of 8 mm.

In FIG. 8A, the solid line represents the measurement result for shifted EBG pattern 42 having conductive patterns 30A with sides of 10 mm, and the dashed line represents the measurement result for conventional EBG pattern 40' having conductive patterns 30A with sides of 10 mm.

As shown in FIG. 8A, with conductive patterns 30A having sides of 10 mm, the value of S21 for conventional EBG pattern 40' is overall lower than that for shifted EBG pattern 42.

In FIG. 8B, the solid line represents the measurement result for shifted EBG pattern 42 having conductive patterns 30A with sides of 8 mm, and the dashed line represents the measurement result for conventional EBG pattern 40' having conductive patterns 30A with sides of 8 mm.

As shown in FIG. 8B, with conductive patterns 30A having sides of 8 mm, the value of S21 for shifted EBG pattern 42 is overall lower than that for conventional EBG pattern 40'.

Figure 9A:
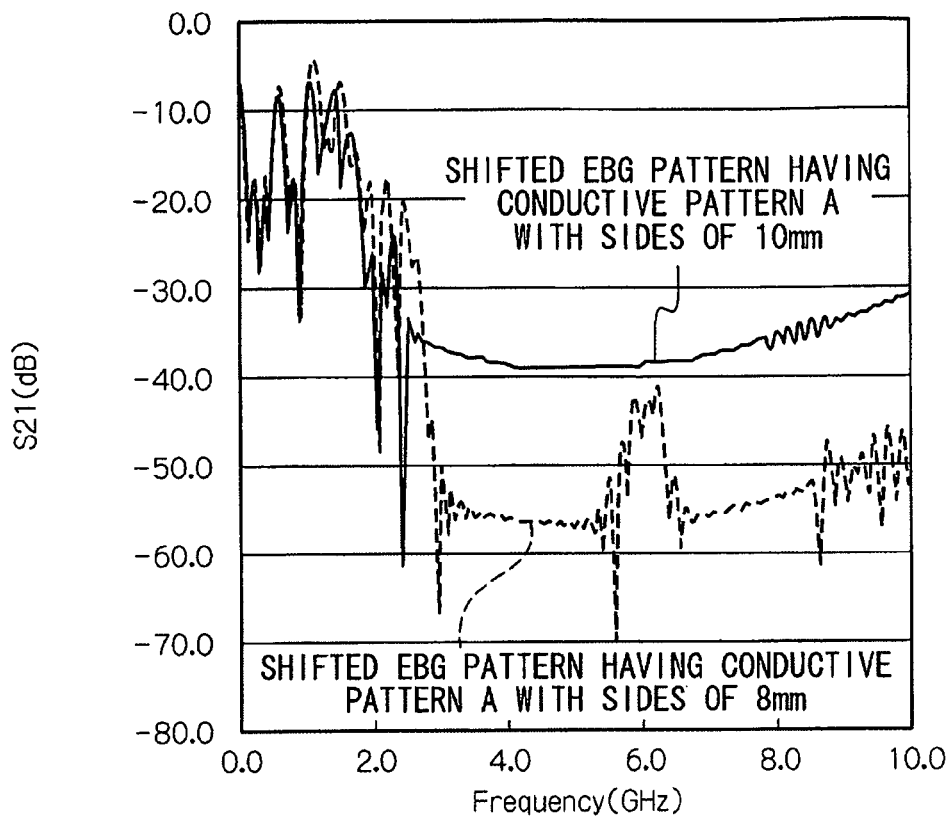
FIG. 9A is a graph showing an example of a measurement result of a variation in S21 with respect to frequency when a signal is propagated, for a shifted EBG pattern having conductive patterns 30A with sides of 10 mm, and a shifted EBG pattern having conductive patterns with sides of 8 mm.
Figure 9B:
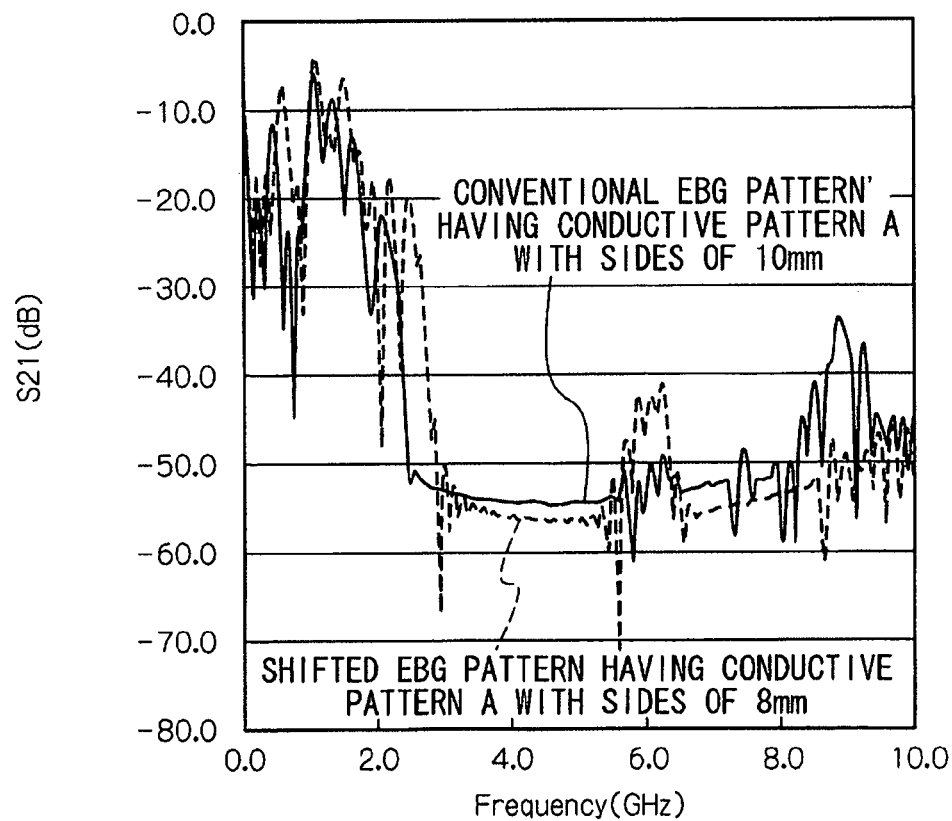
FIG. 9B is a graph showing an example of a measurement result of a variation in S21 with respect to frequency when a signal is propagated, for a conventional EBG pattern having conductive patterns 30A with sides of 10 mm, and a shifted EBG pattern having conductive patterns with sides of 8 mm.

FIG. 9A shows an example of a variation in measurement result of S21 with respect to frequency when a signal propagates from measurement point a to measurement point b for shifted EBG pattern 42 having conductive patterns 30A with sides of 8 mm and shifted EBG pattern 42 having conductive patterns 30A with sides of 10 mm. FIG. 9B shows an example of a variation in measurement result of S21 with respect to frequency when a signal propagates from measurement point a to measurement point b for shifted EBG pattern 42 having conductive patterns 30A with sides of 8 mm and conventional EBG pattern 40' having conductive patterns 30A with sides of 10 mm.

In FIG. 9A, the solid line represents the measurement result of shifted EBG pattern 42 having conductive patterns 30A with sides of 10 mm, and the dashed line represents the measurement result of shifted EBG pattern 42 having conductive patterns 30A with sides of 8 mm.

As shown in FIG. 9A, the value of S21 for shifted EBG pattern 42 having conductive patterns 30A with sides of 8 mm is overall lower than that for shifted EBG pattern 42 having conductive patterns 30A with sides of 10 mm.

In FIG. 9B, the solid line represents the measurement result of conventional EBG pattern 40' having conductive patterns 30A with sides of 10 mm, and the dashed line represents the measurement result of shifted EBG pattern 42 having conductive patterns 30A with sides of 8 mm.

As shown in FIG. 9B, the value of S21 for shifted EBG pattern 42 having conductive patterns 30A with sides of 8 mm is substantially the same as that for conventional EBG pattern 40' having conductive patterns 30A with sides of 10 mm.

Figure 10A:
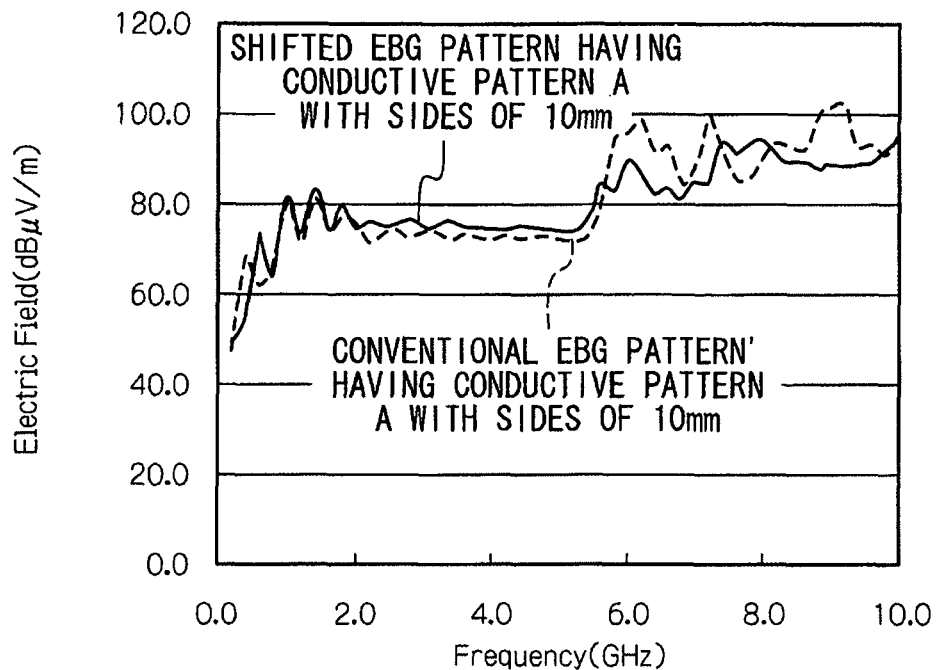
FIG. 10A is a graph showing an example of a measurement result of a variation in emitted electric field strength with respect to frequency when a signal is propagated, for a conventional EBG pattern and a shifted EBG pattern having conductive patterns 30A with sides of 10 mm according to an embodiment of the invention.
Figure 10B:
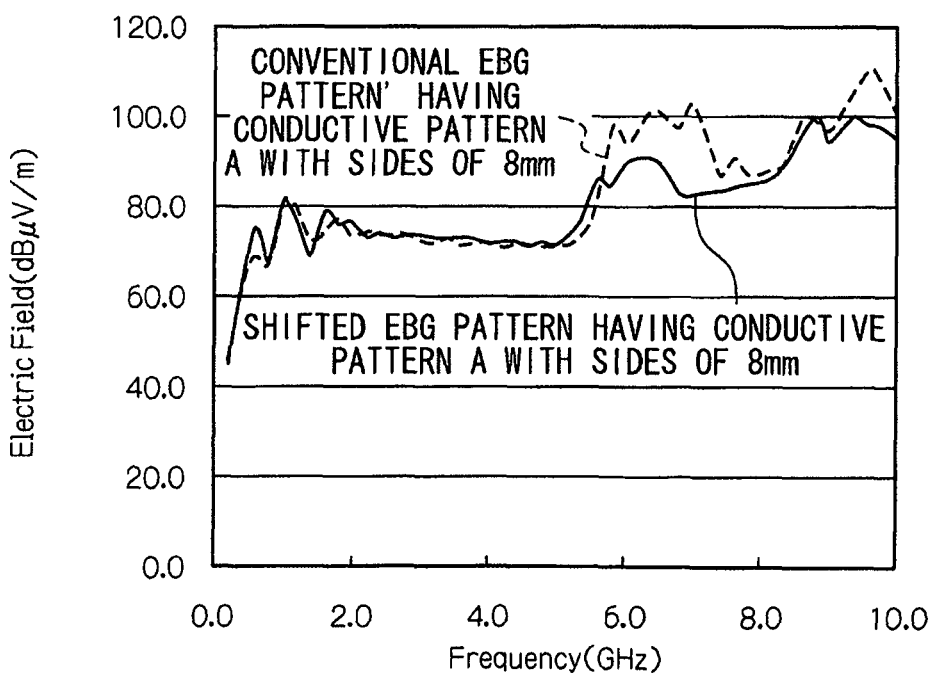
FIG. 10B is a graph showing an example of a measurement result of a variation in emitted electric field strength with respect to frequency when a signal is propagated, for a conventional EBG pattern and a shifted EBG pattern having conductive patterns 30A with sides of 8 mm according to an embodiment of the invention.

FIG. 10A shows an example of a variation in measurement result of emitted electric field strength with respect to frequency when a signal propagates from measurement point a to measurement point b, for conventional EBG pattern 40' and shifted EBG pattern 42 each having conductive patterns 30A with sides of 10 mm. FIG. 10B shows an example of a variation in measurement result of emitted electric field strength with respect to frequency when a signal propagates from measurement point a to measurement point b, for conventional EBG pattern 40' and shifted EBG pattern 42 each having conductive patterns 30A with sides of 8 mm.

In FIG. 10A, the solid line represents the measurement result of shifted EBG pattern 42 having conductive patterns 30A with sides of 10 mm, and the dashed line represents the measurement result of conventional EBG pattern 40' having conductive patterns 30A with sides of 10 mm.

As shown in FIG. 10A, with conductive patterns 30A having sides of 10 mm, the value of emitted electric field strength for shifted EBG pattern 42 is overall lower than that for conventional EBG pattern 40'.

In FIG. 10B, the solid line represents the measurement result of shifted EBG pattern 42 having conductive patterns 30A with sides of 8 mm, and the dashed line represents the measurement result of conventional EBG pattern 40' having conductive patterns 30A with sides of 8 mm.

As shown in FIG. 10B with conductive patterns 30A having sides of 8 mm, the value of emitted electric field strength for shifted EBG pattern 42 is overall lower than that for conventional EBG pattern 40'.

Figure 11A:
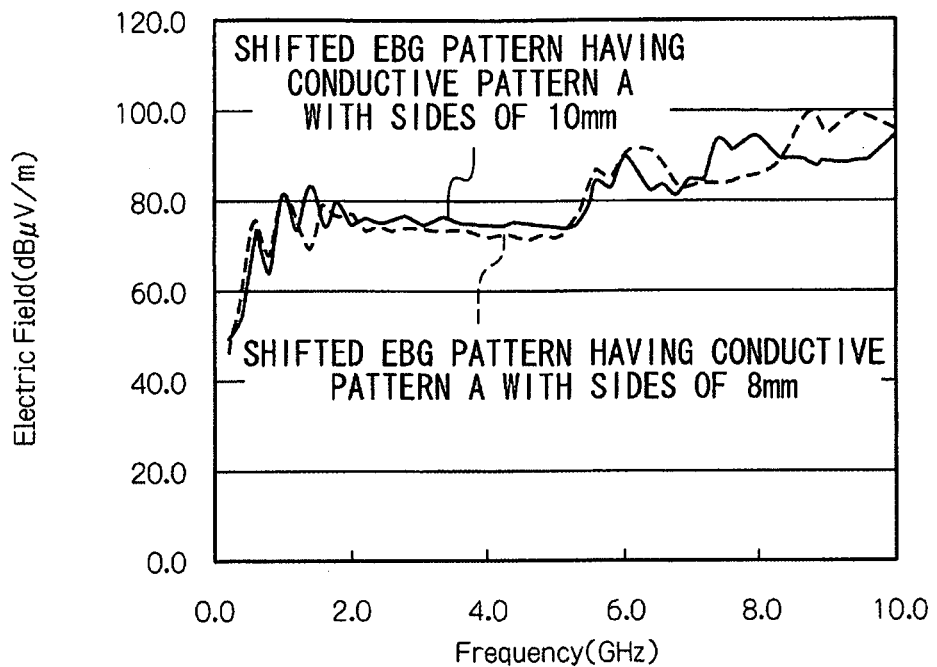
FIG. 11A is a graph showing an example of a measurement result of a variation in emitted electric field strength with respect to frequency when a signal is propagated, for a shifted EBG pattern having conductive patterns 30A with sides of 10 mm according to an embodiment of the invention, and a shifted EBG pattern having a conductive patterns 30A with sides of 8 mm.
Figure 11B:
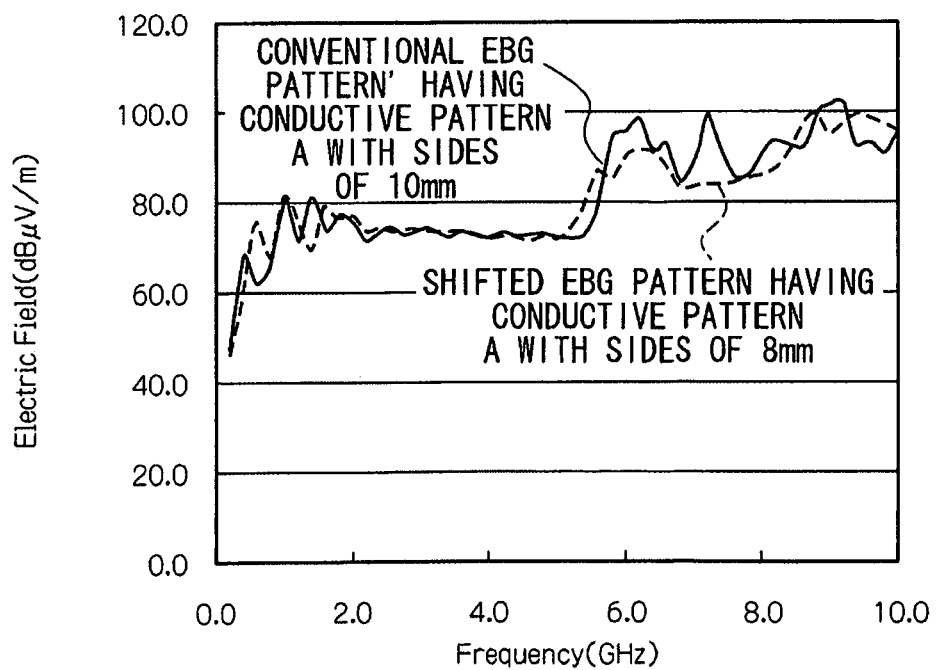
FIG. 11B is a graph showing an example of a measurement result of a variation in emitted electric field strength with respect to frequency when a signal is propagated, for a conventional EBG pattern having conductive patterns 30A with sides 10 mm, and a shifted EBG pattern having a conductive patterns 30A with sides of 8 mm according to an embodiment of the invention.

FIG. 11A shows an example of a variation in measurement result of emitted electric field strength with respect to frequency when a signal propagates from measurement point a to measurement point b, for shifted EBG pattern 42 having conductive patterns 30A with sides of 8 mm and shifted EBG pattern 42 having conductive patterns 30A with sides of 10 mm. FIG. 11B shows an example of a variation in measurement result of emitted electric field strength with respect to frequency when a signal propagates from measurement point a to measurement point b, for shifted EBG pattern 42 having conductive pattern 30A with sides of 8 mm, and conventional EBG pattern 40' having conductive pattern 30A with sides of 10 mm.

In FIG. 11A, the solid line represents the measurement result of shifted EBG pattern 42 having conductive patterns 30A with sides of 10 mm, and the dashed line represents the measurement result of shifted EBG pattern 42 having conductive patterns 30A with sides of 8 mm.

As shown in FIG. 11A, the emitted electric field strength value for shifted EBG pattern 42 having conductive patterns 30A with sides of 8 mm and that for shifted EBG pattern 42 having conductive patterns 30A with sides of 10 mm are similar.

In FIG. 11B, the solid line represents the measurement result of conventional EBG pattern 40' having conductive pattern 30A with sides of 10 mm, and the dashed line represents the measurement result of shifted EBG pattern 42 having conductive pattern 30A with sides of 8 mm.

As shown in FIG. 11B, the value of emitted electric field strength for shifted EBG pattern 42 having conductive pattern 30A with sides of 10 mm is overall lower than that for conventional EBG pattern 40' having conductive pattern 30A with sides of 10 mm.

Table 1 shows S21 and emitted electric field strength characteristics for each EBG pattern based on the measurement results shown in FIGS. 8A through 11B.

In Table 1, "Low" indicates that an EBG pattern has S21 values and/or emitted electric field strength values lower than the other EBG patterns, while "High" indicates that an EBG pattern has S21 and/or emitted electric field strength values which are not lower than the other EBG patterns. In other words, the more "Low" values that a given EBG pattern has, the more it can suppress propagated noise and emitted electric fields from an EBG pattern from measurement point a to measurement point b. Table 1 shows that the pattern that most effectively suppresses noise and emitted electric fields is a shifted EBG pattern 42 having conductive patterns 30A with sides of 8 mm, having the configuration shown in FIG. 3.

TABLE 1

|  | S21 | Emitted electric field strength |
|---|---|---|
| Conventional EBG pattern having conductive pattern A with sides of 10 mm | Low | High |
| Shifted EBG pattern having conductive pattern A with sides of 10 mm | High | Low |
| Conventional EBG pattern having conductive pattern A with sides of 8 mm | High | High |
| Shifted EBG pattern having conductive pattern A with sides of 8 mm | Low | Low |

Next, with reference to FIGS. 12A-13B, a variation in S21 and emitted electric field strength with respect to frequency when a signal propagates in the y direction will be explained with respect to each of a conventional EBG pattern 40' and a shifted EBG pattern 42.

Conventional EBG pattern 40' and shifted EBG pattern 42 which are the subject of the present measurement have the same shapes as conventional EBG pattern 40' shown in FIG. 2B and shifted EBG pattern 42 shown in FIG. 3, respectively. Conductive patterns 30A thereof are square shapes with sides of 8 mm, while conductive patterns 30B and conductive patterns 30C are each rectangular shapes 7.5 mm long and 1 mm wide.

Figure 12A:
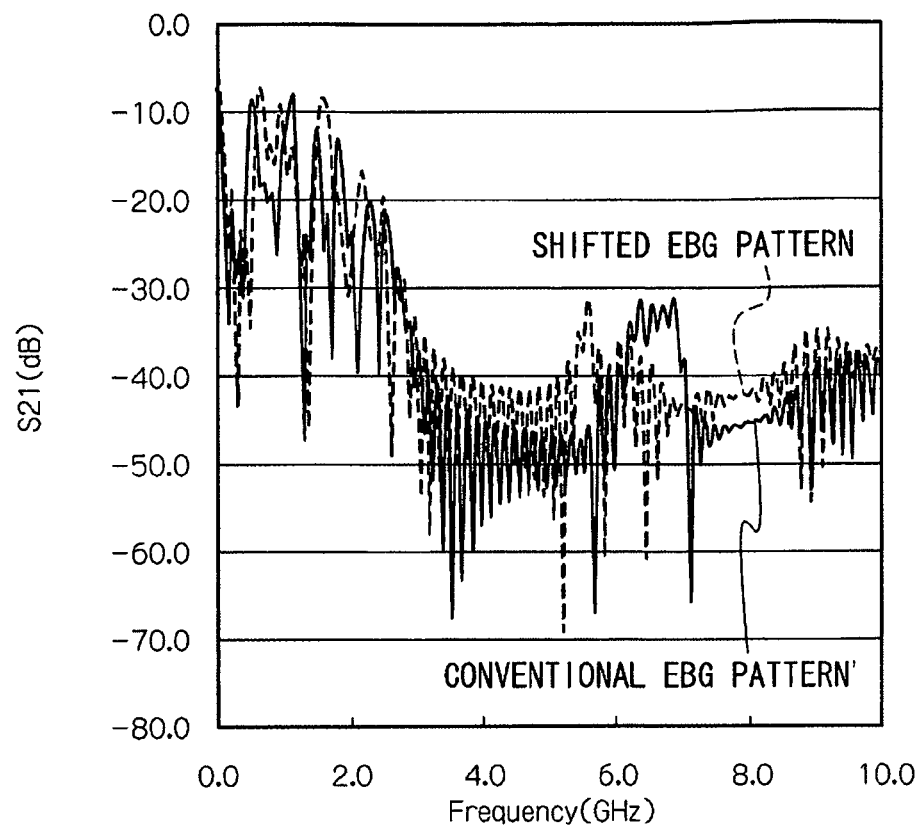
FIG. 12A is a graph showing an example of a measurement result of a variation in S21 with respect to frequency when a signal is propagated in a y direction, for a shifted EBG pattern according to an embodiment of the invention and a conventional EBG pattern.
Figure 12B:
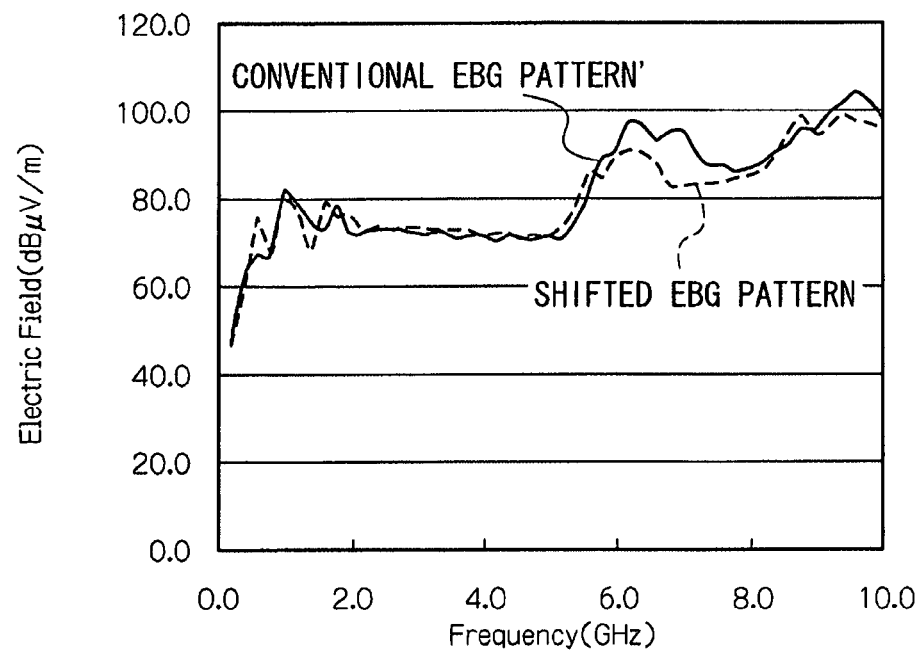
FIG. 12B is a graph showing an example of a measurement result of a variation in emitted electric field strength with respect to frequency when a signal is propagated in a y direction, for a shifted EBG pattern according to an embodiment of the invention and a conventional EBG pattern.

FIG. 12A shows an example of a measurement result of a variation in S21 with respect to frequency when a signal propagates from measurement point a to measurement point c, for each of shifted EBG pattern 42 and conventional EBG pattern 40'. FIG. 12B shows a corresponding example of a measurement result of a variation in emitted electric field strength with respect to frequency.

In FIG. 12A and FIG. 12B, the solid line represents the measurement result of conventional EBG pattern 40', and the dashed line represents the measurement result of shifted EBG pattern 42.

As shown in FIG. 12A, the value of S21 for shifted EBG pattern 42 is not substantially lower than the value of S21 for conventional EBG pattern 40', but, as shown in FIG. 12B, the value of emitted electric field strength for shifted EBG pattern 42 is substantially lower than that for conventional EBG pattern 40, in the range of 6-8 GHz.

Figure 13A:
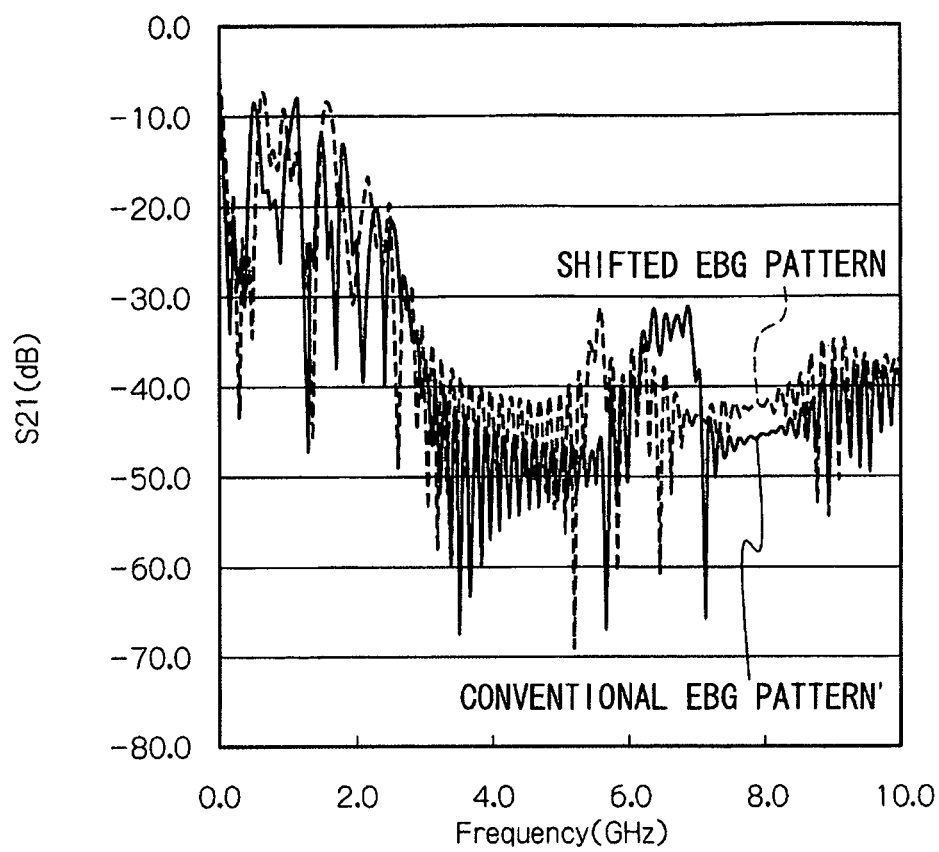
FIG. 13A is a graph showing an example of a measurement result of a variation in S21 with respect to frequency when a signal is propagated in a y direction, for a shifted EBG pattern according to an embodiment of the invention and a conventional EBG pattern.
Figure 13B:
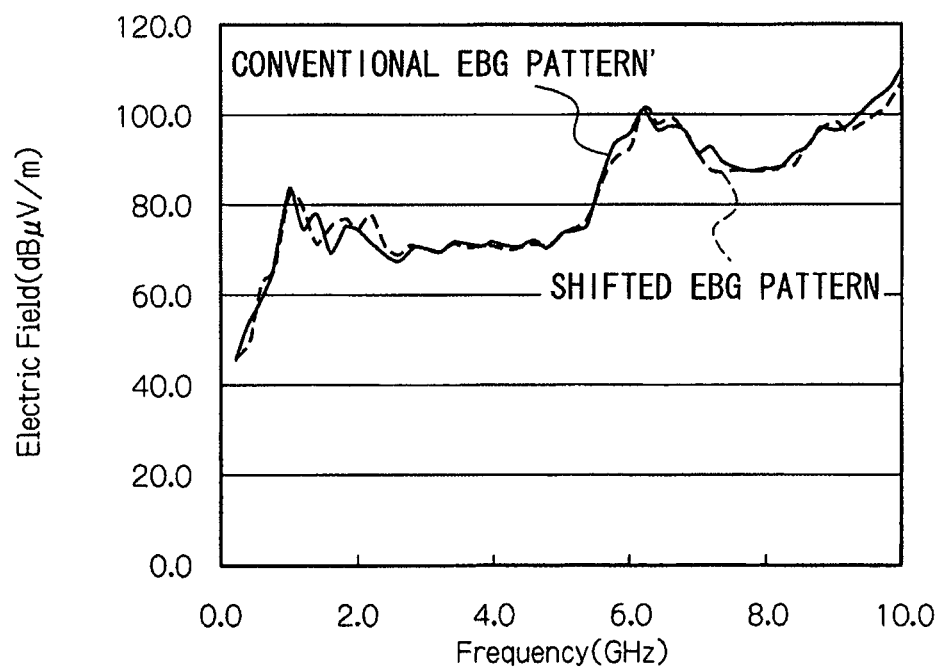
FIG. 13B is a graph showing an example of a measurement result of a variation in emitted electric field strength with respect to frequency when a signal is propagated in a y direction, for a shifted EBG pattern according to an embodiment of the invention and a conventional EBG pattern.

FIG. 13A shows an example of a measurement result of a variation in S21 with respect to frequency when a signal propagates from measurement point e to measurement point f, for each of shifted EBG pattern 42 and conventional EBG pattern 40'. FIG. 13B shows a corresponding example of a measurement result of a variation in emitted electric field strength with respect to frequency.

In FIGS. 13A and 13B, the solid line represents the measurement result of conventional EBG pattern 40' and the dashed line represents the measurement result of shifted EBG pattern 42.

As shown in FIG. 13A, the value of S21 for shifted EBG pattern 42 is not substantially lower than the value of S21 for conventional EBG pattern 40', and, as shown in FIG. 13B, there is no substantial difference therebetween with respect to emitted electric field strength.

Second Embodiment

In the second embodiment, explanation is given of a case in which conductive pattern 30A has a circular shape. The configuration of motherboard 10 for the second embodiment is similar to that of the first embodiment (see FIG. 1).

Figure 14:
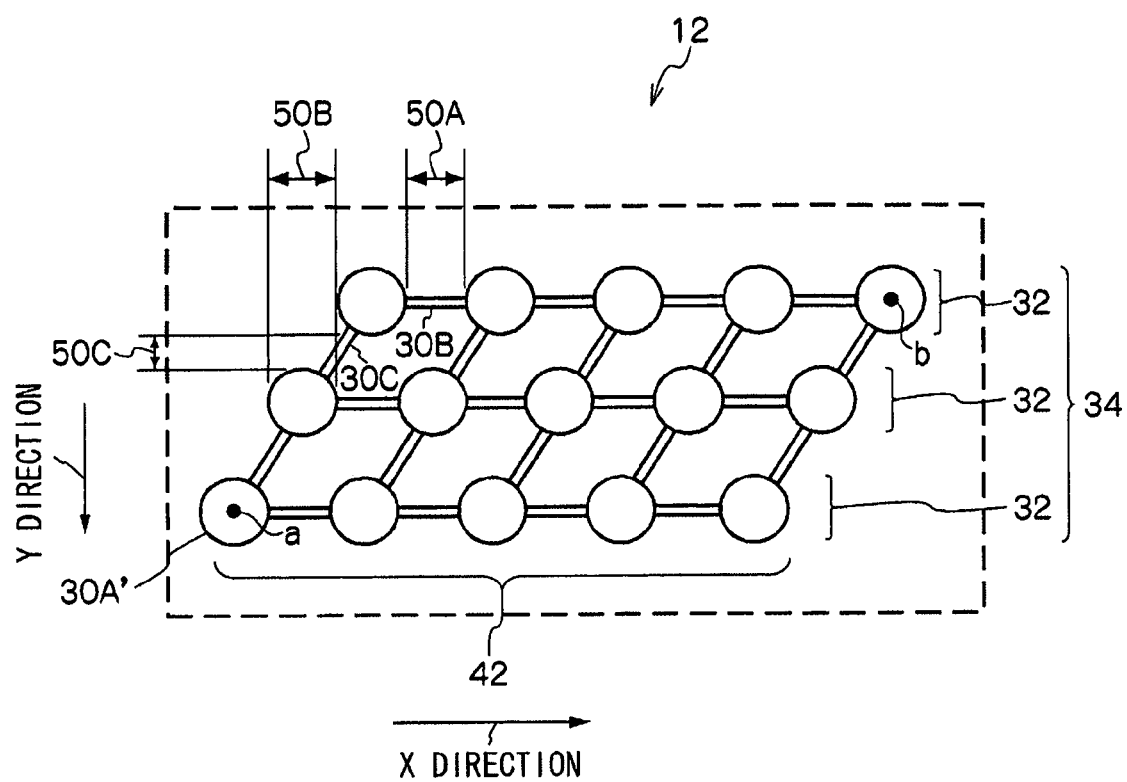
FIG. 14 is a schematic view showing a structure of a shifted EBG pattern according to a second embodiment of the invention.

FIG. 14 shows the structure of shifted EBG pattern 42 according to the second embodiment. Further, those elements of FIG. 14 which are the same as those of FIG. 3 have the same reference numbers, and explanation thereof is omitted.

As shown in FIG. 14, conductive pattern 30A' in shifted EBG pattern 42 according to the second embodiment has a circular shape, respective lengths of gaps 50A and 50B each being substantially equal to a diameter of conductive pattern 30A', conductive pattern 30B having a rectangular shape with a length substantially equal to the diameter of conductive pattern 30A'. Conductive pattern 30C of shifted EBG pattern 42 according to the second embodiment is also a rectangular shape that has a length substantially equal to the diameter of conductive pattern 30A'. Conductive patterns 30C extend at an angle less than 90 degrees with respect to the y direction.

In shifted ERG pattern 42 according to the second embodiment, conductive patterns 30A' have a diameter of 8 mm, and shifted EBG pattern 42 includes three rows of conductive pattern rows 32 arranged adjacently in the y direction, each row including five conductive patterns 30A' arranged in the x direction. Board 12 is a rectangular shape 92.5 mm long and 46 mm wide.

Figure 15A:
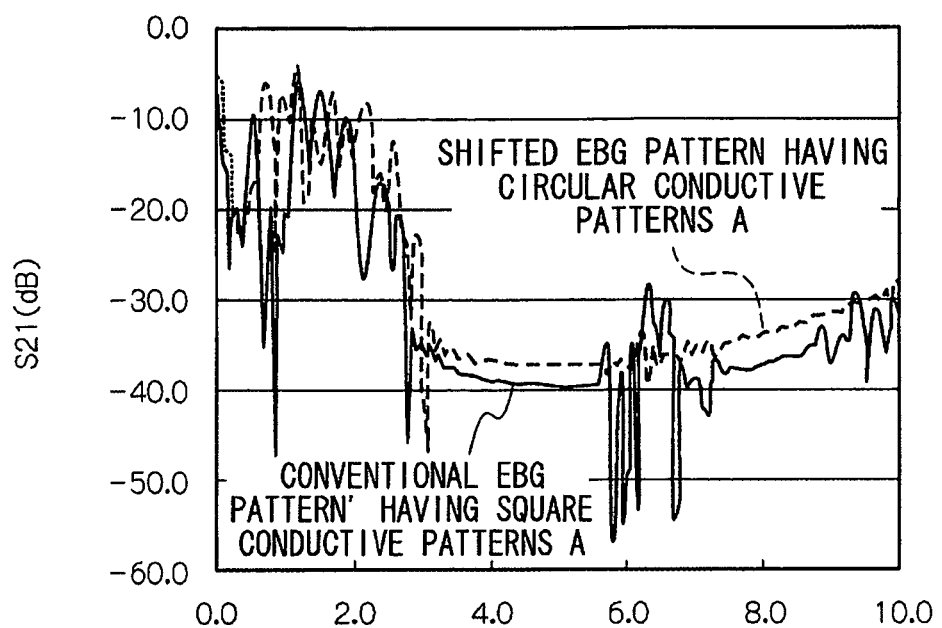
FIG. 15A is a graph showing an example of a measurement result of a variation in S21 with respect to frequency when a signal is propagated, for a shifted EBG pattern according to the second embodiment and a conventional EBG pattern.
Figure 15B:
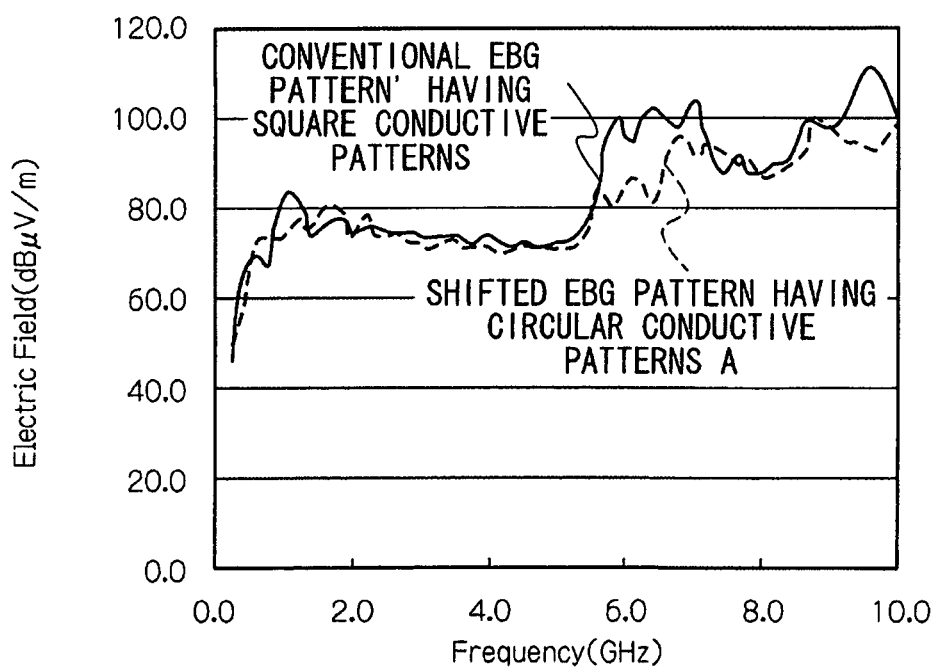
FIG. 15B is a graph showing an example of a measurement result of a variation in emitted electric field strength with respect to frequency when a signal is propagated, for a shifted EBG pattern according to the second embodiment and a conventional EBG pattern.

FIG. 15A shows an example of a variation in measurement result of S21 with respect to frequency when a signal propagates from measurement point a to measurement point b, for shifted EBG pattern 42 having a conductive pattern 30A' with a diameter of 8 mm as shown in FIG. 14, and conventional EBG pattern 40' having a square conductive pattern 30A with sides of 8 mm as shown in FIG. 2B. FIG. 15B shows a corresponding example of measurement results of a variation in emitted electric field strength with respect to frequency for these EBG patterns.

In FIGS. 15A and 15B, the solid line represents the measurement result of conventional EBG pattern 40' having square conductive patterns 30A with sides of 8 mm, and the dashed line represents the measurement result of shifted EBG pattern 42 having circular conductive patterns 30A' with diameters of 8 mm.

As shown in FIG. 15A the value of S21 for shifted EBG pattern 42 having circular conductive patterns 30A' with diameters of 8 mm, is not substantially lower than the value of S21 for conventional EBG pattern 40' having square conductive patterns 30A with sides of 8 mm; however, as shown in FIG. 15B, the value of emitted electric field strength for shifted EBG pattern 42 is substantially lower than that for conventional EBG pattern 40' in the 6-7 GHz range.

Third Embodiment

In the third embodiment, a case in which conductive patterns 30A are connected to other conductive patterns 30A only in the y direction via conductive patterns 30C will be described. Since the configuration of motherboard 10 according to the third embodiment is similar to that of the first embodiment (see FIG. 1), explanation thereof is omitted.

Figure 16:
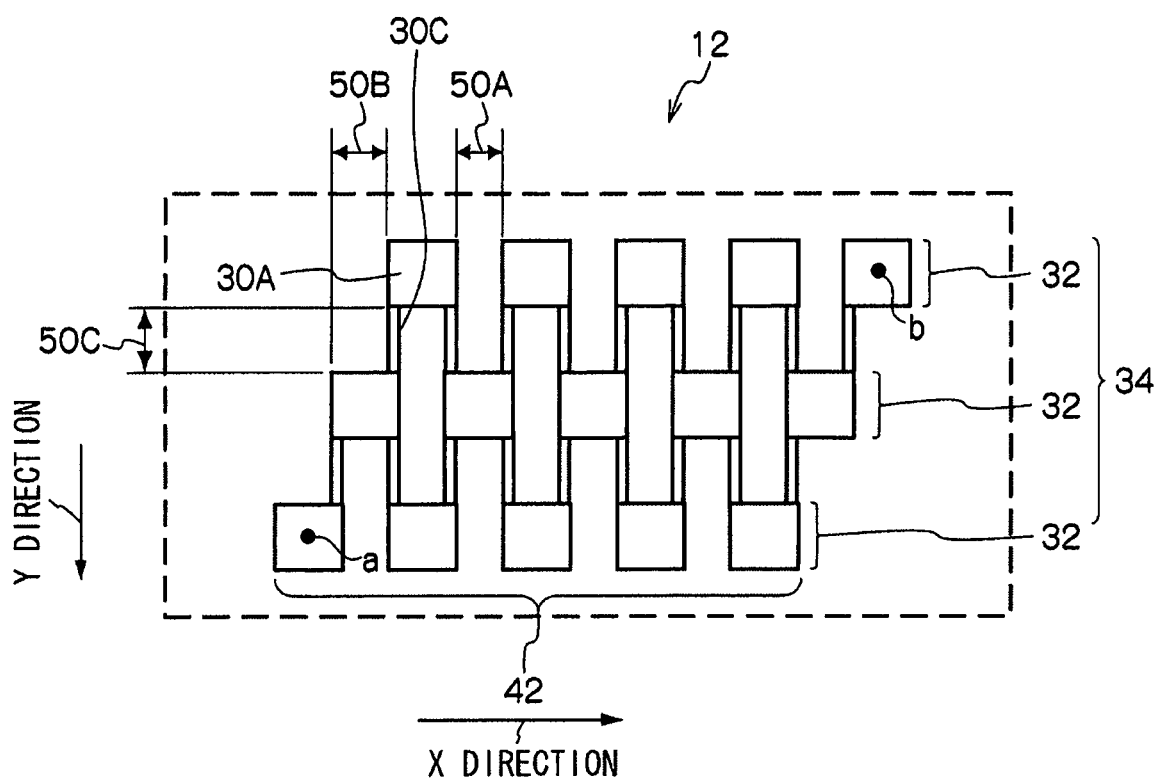
FIG. 16 is a schematic view showing a structure of a shifted EBG pattern according to a third embodiment of the invention.

FIG. 16 shows the structure of shifted EBG pattern 42 according to the third embodiment. Further, those elements of FIG. 16 which are the same as those of FIG. 3 have the same reference numbers, and explanation thereof is omitted.

As shown in FIG. 16, in shifted EBG pattern 42 according to the third embodiment, one conductive pattern 30A located at one end of a conductive pattern row 32 is connected to one adjacent conductive pattern 30A in the y direction, and the other conductive patterns 30A in the same row, apart from the one conductive pattern 30A at the one end, are each connected in the y direction to two conductive patterns 30A adjacent in the y direction.

Conductive pattern 30A of shifted EBG pattern 42 according to the third embodiment has a square shape with one side facing in the x direction. Gaps 50A and 50B have a length substantially equal to the sides of conductive pattern 30A. Conductive pattern 30C has a rectangular shape. In shifted EBG pattern 42 according to the third embodiment, the length of gap 50C is substantially equal to the sides of conductive pattern 30A, and a length of conductive pattern 30C is also substantially equal to the sides of conductive pattern 30A.

In shifted EBG pattern 42 according to the third embodiment, conductive pattern 30A has a square shape with sides of length 8 mm, and shifted EBG pattern 42 includes three conductive pattern rows 32 arranged adjacently in the y direction, each row including five conductive patterns 30A arranged in the x direction. Board 12 has a rectangular shape 92.5 mm long and 46 mm wide.

Figure 17A:
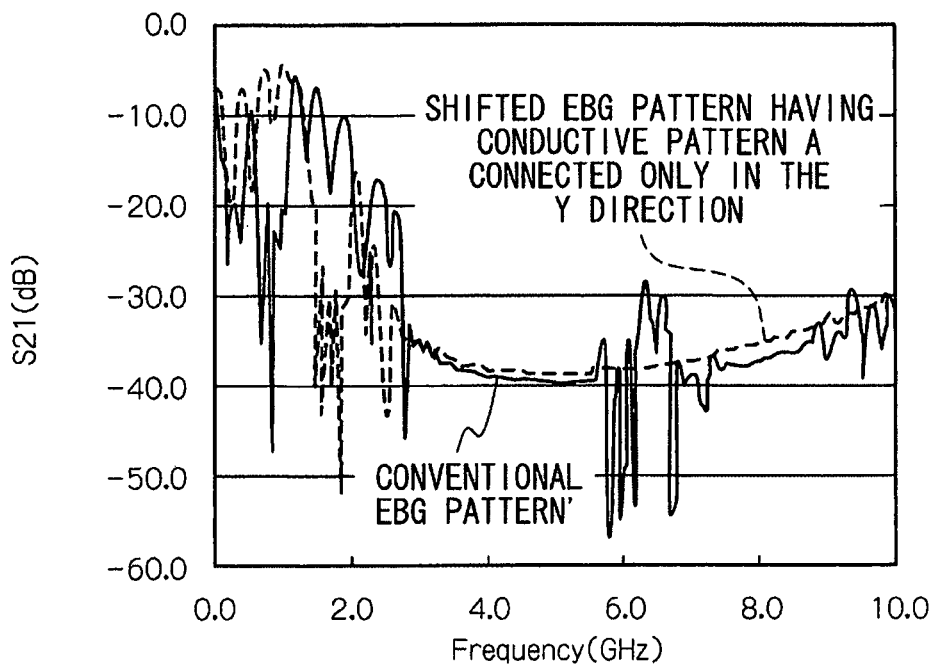
FIG. 17A is a graph showing an example of a measurement result of a variation in S21 with respect to frequency when a signal is propagated, for a shifted EBG pattern according to the third embodiment and a conventional EBG pattern.
Figure 17B:
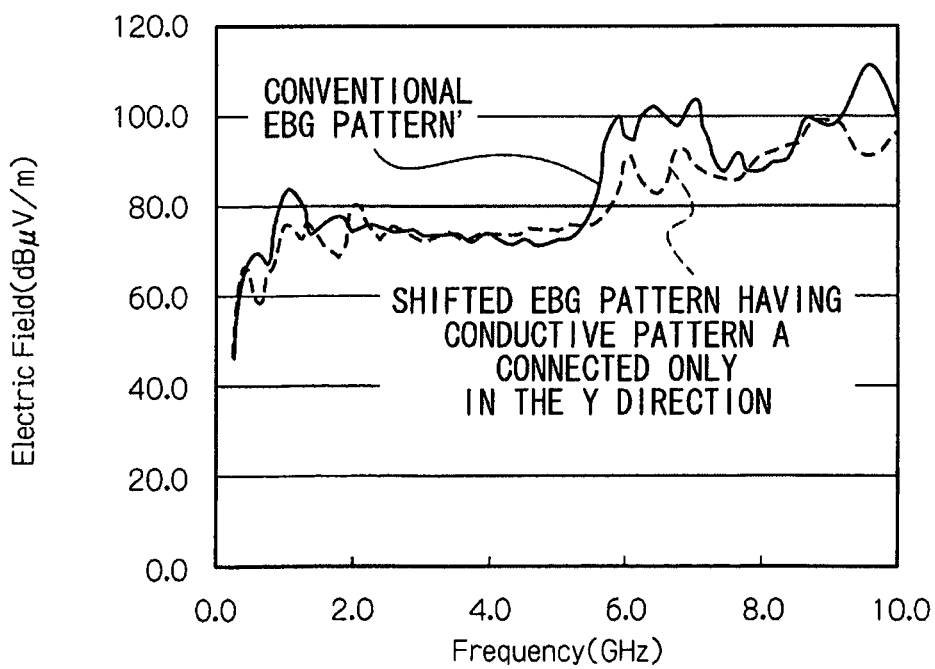
FIG. 17B is a graph showing an example of a measurement result of a variation in emitted electric field strength with respect to frequency when a signal is propagated, for a shifted EBG pattern according to the third embodiment and a conventional EBG pattern.

FIG. 17A shows an example of a variation in measurement result of S21 with respect to frequency when a signal propagates from measurement point a to measurement point b, for shifted EBG pattern 42 having conductive patterns 30A connected only the y direction shown in FIG. 16, and conventional EBG pattern 40' shown in FIG. 2B. FIG. 17B shows an example of a measurement result of a variation in emitted electric field strength with respect to frequency.

In FIGS. 17A and 17B, the solid line represents the measurement result of conventional EBG pattern 40' shown in FIG. 2B, and the dashed line represents the measurement result of shifted EBG pattern 42 having conductive patterns 30A connected only in the y direction.

As shown in FIG. 17A, the value of S21 for shifted EBG pattern 42 having conductive patterns 30A connected only in the y direction is not substantially lower than the value of S21 for conventional EBG pattern 40' shown in FIG. 2B; however, as shown in FIG. 17B, the value of emitted electric field strength is substantially lower in the 6-7 GHz range.

Fourth Embodiment

In the fourth embodiment, an exemplary embodiment in which adjacent conductive patterns 30A are arranged in an offset manner will be described. Since the configuration of motherboard 10 in the fourth embodiment is similar to that of the first embodiment (see FIG. 1), description thereof is omitted.

Figure 18A:
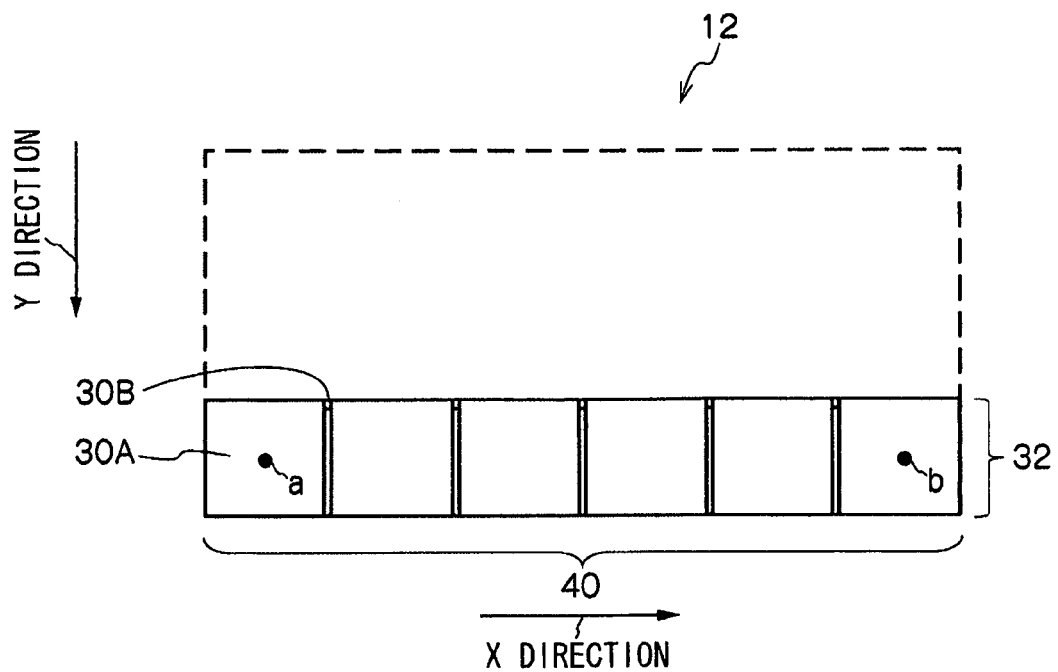
FIG. 18A is a schematic view showing a structure of a conventional EBG pattern relating to a fourth embodiment of the invention.
Figure 18B:
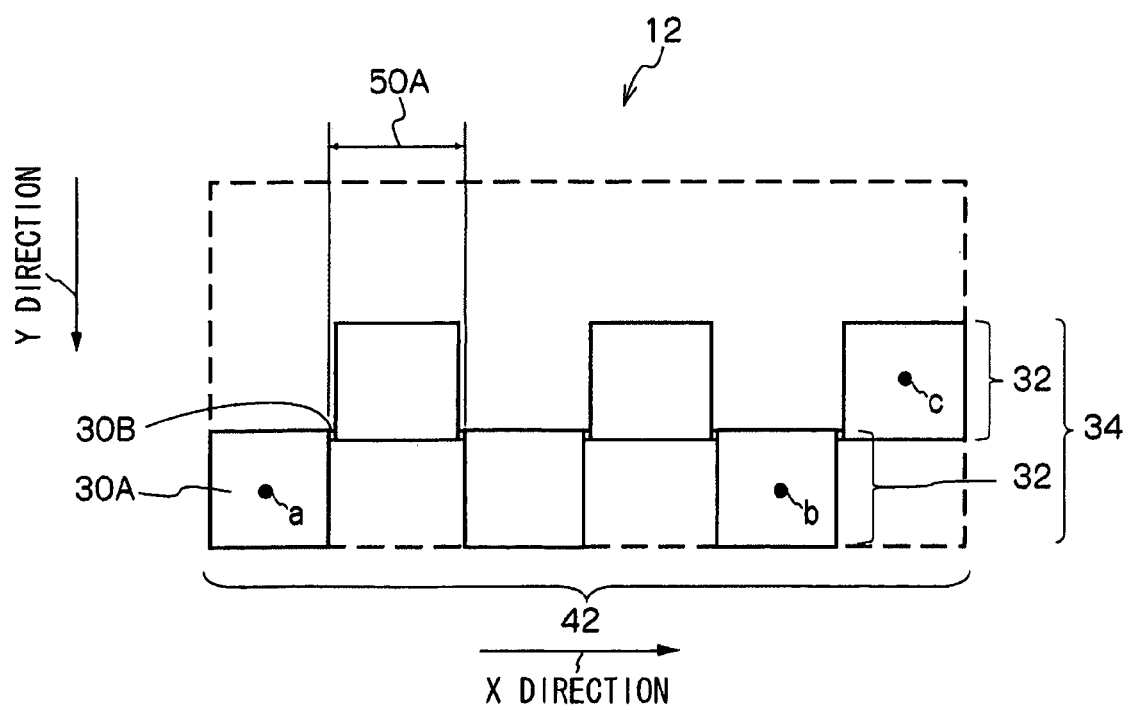
FIG. 18B is a schematic view showing a structure of a shifted EBG pattern according to a fourth embodiment of the invention.

FIG. 18A shows the configuration of conventional EBG pattern 40 relating to the fourth embodiment, and FIG. 18B shows the configuration of shifted EBG pattern 42 according to the fourth embodiment. Further, those elements of FIGS. 18A and 18B which are the same as those of FIG. 3 have the same reference numbers, and explanation thereof is omitted.

Conventional EBG pattern 40 shown in FIG. 18A includes one conductive pattern row 32 including plural conductive patterns 30A arranged adjacently in the x direction, respective conductive patterns 30B connecting adjacent conductive patterns 30A.

Shifted EBG pattern 42 shown in FIG. 18B includes conductive pattern rows 32 which include plural conductive patterns 30A arranged adjacently in the x direction separated by respective gaps 50A. Plural conductive pattern rows 32 are arranged adjacently in the y direction such that portions of conductive patterns 30A of one conductive pattern row 32 may be inserted into gaps 50A of another conductive pattern row 32, thereby forming a conductive pattern group 34. The portions of conductive patterns 30A of one adjacent conductive pattern row 32 are connected in the x direction to conductive patterns 30A of the other row by plural conductive patterns 30B. Thereby, conductive patterns 30A are arranged in an offset manner.

In conventional EBG pattern 40 and shifted EBG pattern 42 according to the fourth embodiment, conductive pattern 30A has a square shape with sides of 15 mm. Conductive pattern 30B has a rectangular shape with 0.5 mm long and 1 mm wide. Board 12 has a rectangular shape with 92.5 mm long and 46 mm wide.

Shifted EBG pattern 42 according to the fourth embodiment includes two conductive pattern rows 32 arranged adjacently in the y direction, each including three conductive patterns 30A arranged in the x direction.

Figure 19A:
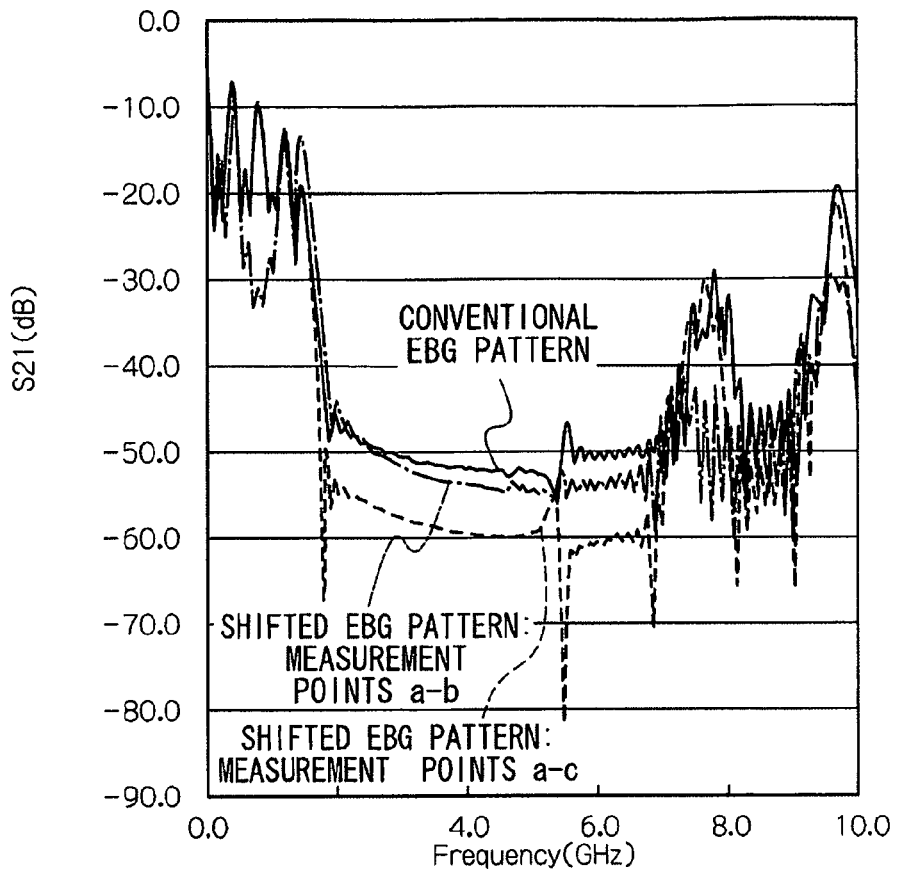
FIG. 19A is a graph showing an example of a measurement result of a variation in S21 with respect to frequency when a signal is propagated, for a shifted EBG pattern according to the fourth embodiment and a conventional EBG pattern.
Figure 19B:
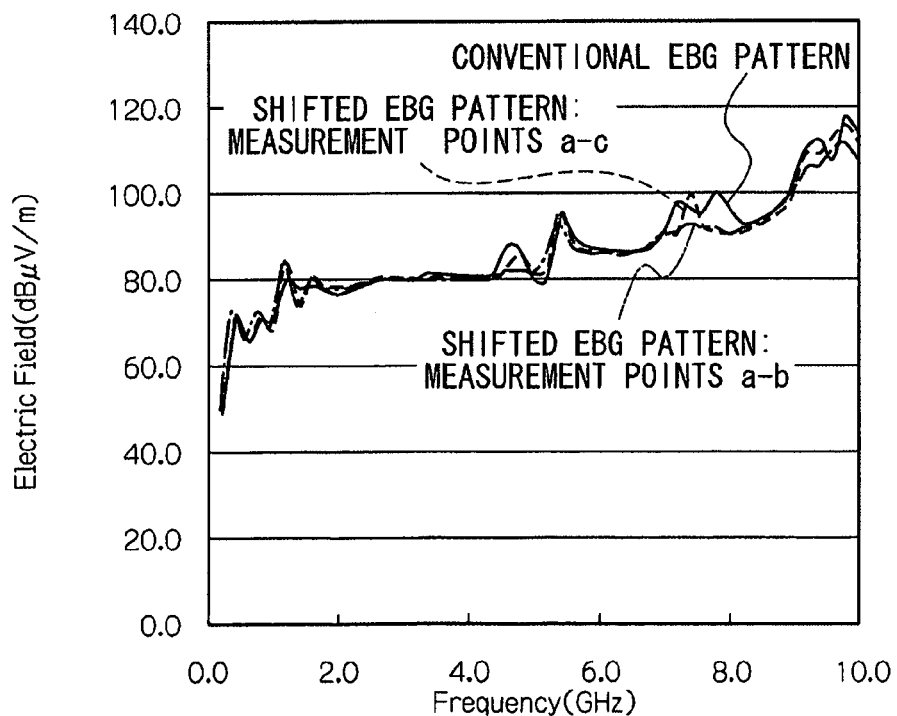
FIG. 19B is a graph showing an example of a measurement result of a variation in emitted electric field strength with respect to frequency when a signal is propagated, in a shifted EBG pattern according to the fourth embodiment and a conventional EBG pattern.

FIG. 19A shows an example of a variation in a measurement result of S21 with respect to frequency when a signal propagates from measurement point a to measurement point b, and from measurement point a to measurement point c, for each of conventional EBG pattern 40 shown in FIG. 18A and shifted EBG pattern 42 shown in FIG. 18B. FIG. 19B shows a corresponding example of a variation in a measurement result of emitted electric field strength with respect to frequency for these EBG patterns.

In FIGS. 19A and 19B, the solid line represents the measurement result from measurement point a to measurement point b of conventional EBG pattern 40, the dot-dash line represents the measurement result of shifted EBG pattern 42 from measurement point a to measurement point b, and the dashed line represents the measurement result of shifted EBG pattern 42 from measurement point a to measurement point c.

As shown in FIG. 19A, the value of S21 for shifted EBG pattern 42 is substantially lower than the value of S21 for conventional EBG pattern 40. In particular the measurement result for shifted EBG pattern 42 is substantially lower from measurement point a to measurement point c.

As shown in FIG. 19B, the value of emitted electric field strength for shifted EBG pattern 42 is lower than the value of emitted electric field strength for conventional EBG pattern 40 in the range of 7-8 GHz.

Next, with reference to FIGS. 20A, 20B and 21, explanation will be given of a comparative case in which conductive patterns 30A of the EBG patterns shown in FIGS. 18A and 18B are reduced in number.

Figure 20A:
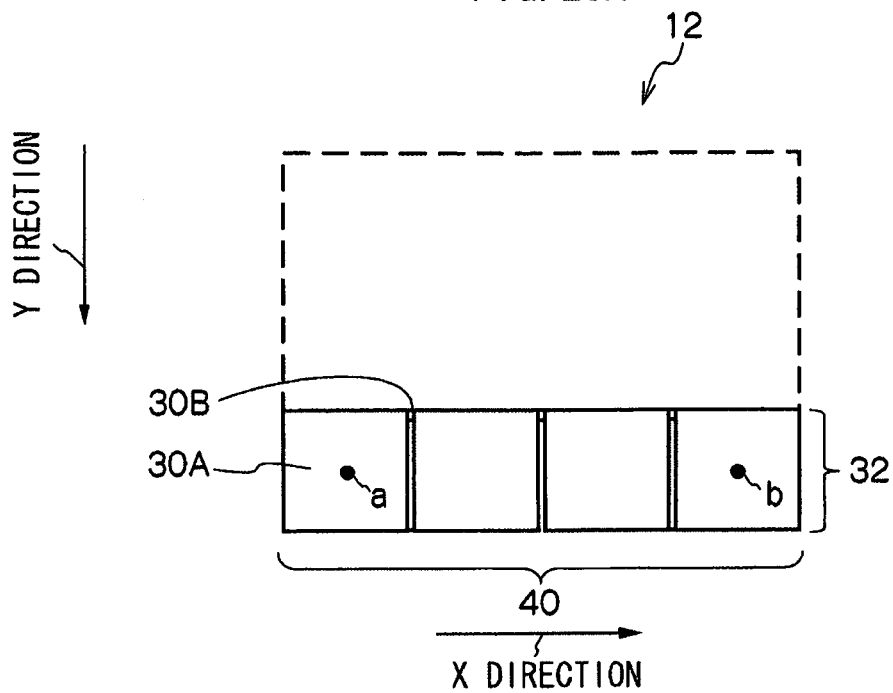
FIG. 20A is a schematic view showing another structure of a conventional EBG pattern relating to a fourth embodiment of the invention.

Conventional EBG pattern 40 shown in FIG. 20A includes a single conductive pattern row 32 including four conductive patterns 30A arranged in the x direction. Shifted EBG pattern 42 shown in FIG. 20B includes two conductive pattern rows 32 arranged adjacently in the y direction, each including two conductive patterns 30A arranged in the x direction.

Figure 20B:
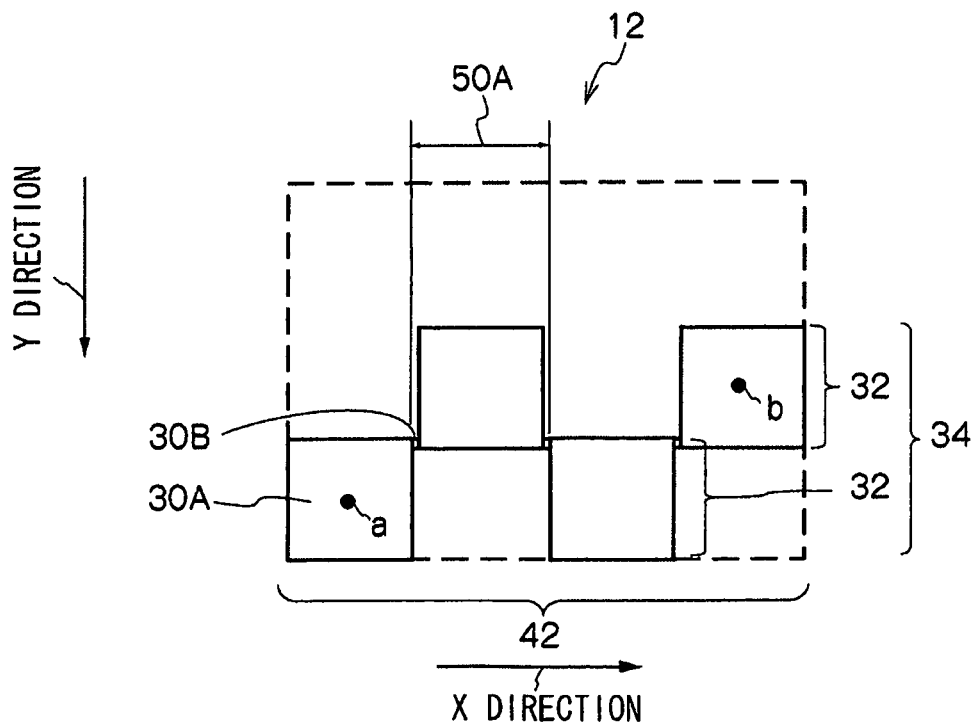
FIG. 20B is a schematic view showing another structure of a shifted EBG pattern according to a fourth embodiment of the invention.

In each of conventional EBG pattern 40 and shifted ERG pattern 42 shown in FIGS. 20A and 20B, conductive pattern 30A has a square shape with sides of 15 mm, and conductive pattern 30B has a rectangular shape 0.5 mm long and 1 mm wide. Board 12 has a rectangular shape 61.5 mm long and 46 mm wide.

Figure 21A:
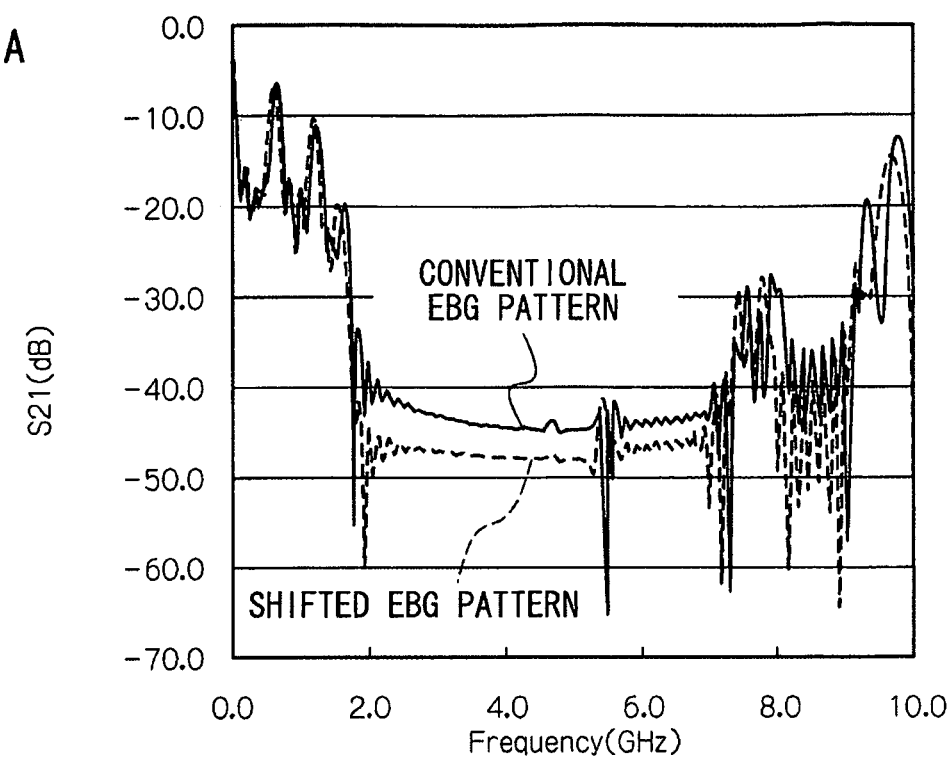
FIG. 21A is a graph showing an example of a measurement result of a variation in S21 with respect to frequency when a signal is propagated, for another shifted EBG pattern according to the fourth embodiment and another conventional EBG pattern.
Figure 21B:
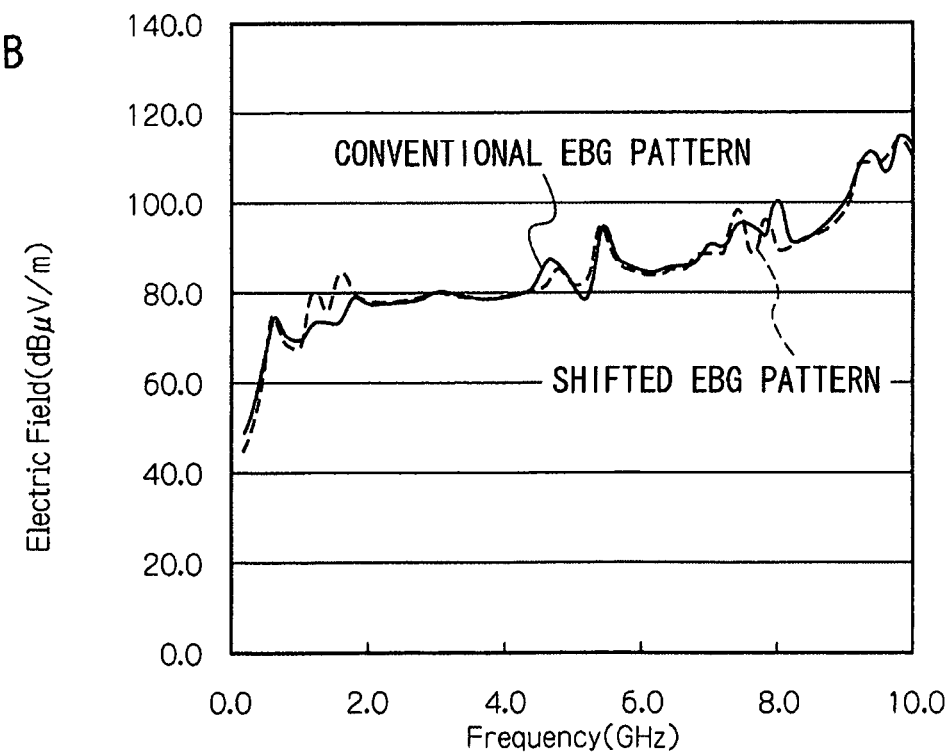
FIG. 21B is a graph showing an example of a measurement result of a variation in emitted electric field strength with respect to frequency when a signal is propagated, for another shifted EBG pattern according to the fourth embodiment and a conventional EBG pattern.
Figure 22:
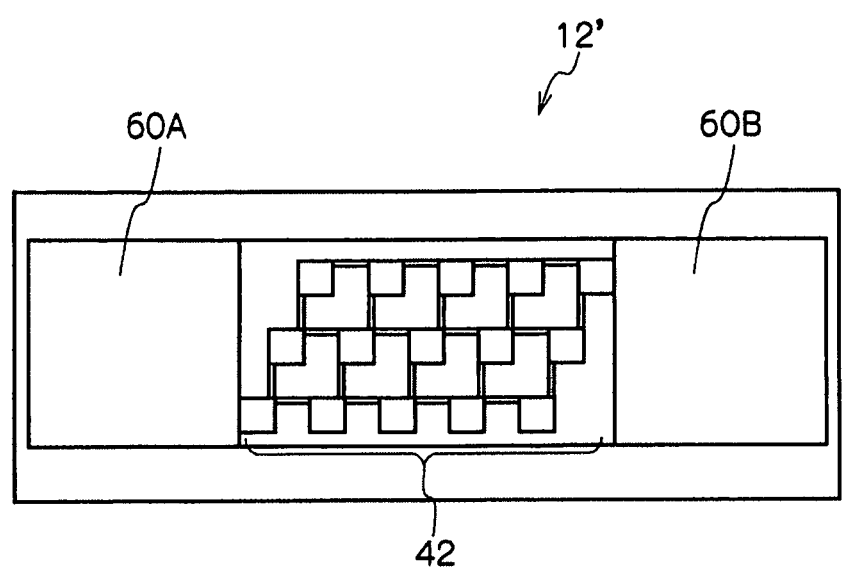
FIG. 22 is a schematic view showing a structure of a board according to another embodiment.

FIG. 21A shows an example of a variation in a measurement result of S21 with respect to frequency when a signal propagates from measurement point a to measurement point b, for each of conventional EBG pattern 40 shown in FIG. 20A and shifted EBG pattern 42 shown in FIG. 20B. FIG. 21B shows a corresponding example of a variation in measurement result of emitted electric field strength with respect to frequency for these EBG patterns.

In FIGS. 21A and 21B, the solid line represents the measurement result of the above conventional EBG pattern 40, and the dashed line represents the measurement result of the above shifted EBG pattern 42.

As shown in FIG. 21A, the value of S21 for shifted EBG pattern 42 is substantially lower than the value of S21 for conventional EBG pattern 40', and, as shown in FIG. 21B, there is no substantial difference in the emitted electric field strength values.

Although the present invention has been explained by means of the above embodiments, the technical scope of the present invention is not limited to the scope of description of these embodiments. Many variations and improvements may be made with respect to the above embodiments, and embodiments having these variations and improvements are included in the scope of the present invention, provided they do not depart from the gist of the invention.

Moreover, the above embodiments do not limit the invention, and the combinations of characteristics disclosed in the explanations of the embodiments are not all necessary to address the issue of the invention. Inventions of various stages are included in the above-described embodiments, and various other inventions may be derived from combinations of plural conditions for configuration disclosed herein. Even if several of the conditions for configuration are removed from the total conditions of configuration disclosed in the above embodiments, those configurations that remain after removal thereof can be derived as the invention, provided the effect of the invention can still be obtained.

For example, the invention is not limited by, for example, the sizes of board 12, conductive pattern 30A and conductive pattern 30B, the number of conductive patterns 30A that form conductive pattern rows 32, the number of conductive pattern rows 32, and the like, disclosed in the above embodiments.

The above embodiments have been explained with respect to a case in which the printed wiring board of the present invention has been used for a motherboard 10 to which can be attached plural circuit boards 20 via connectors 14. However, the present invention is not limited thereto, and a board 12' provided with plural circuits 60A and 60B may be used, in which shifted EBG pattern 42 is formed in a power supply layer of board 12'

Additionally, the configurations of the EBG patterns explained in the above embodiments (see FIGS. 3, 7 and 14), are merely examples, and unnecessary portions may be deleted therefrom, and new portions may be added thereto, provided it does not depart from the gist of the invention.

Figure 23A:
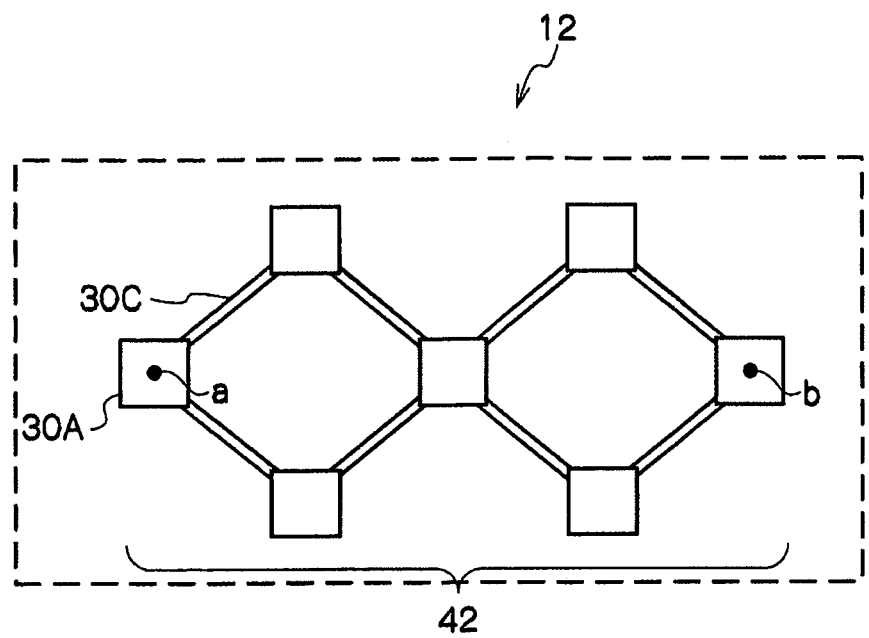
FIG. 23A is a schematic view showing a structure of a shifted EBG pattern according to another embodiment.

For example, as shown in FIG. 23A, a shifted EBG pattern 42 in which conductive patterns 30A adjacent in the y direction are connected by conductive patterns 30C that are inclined in the y direction may be used.

Figure 23B:
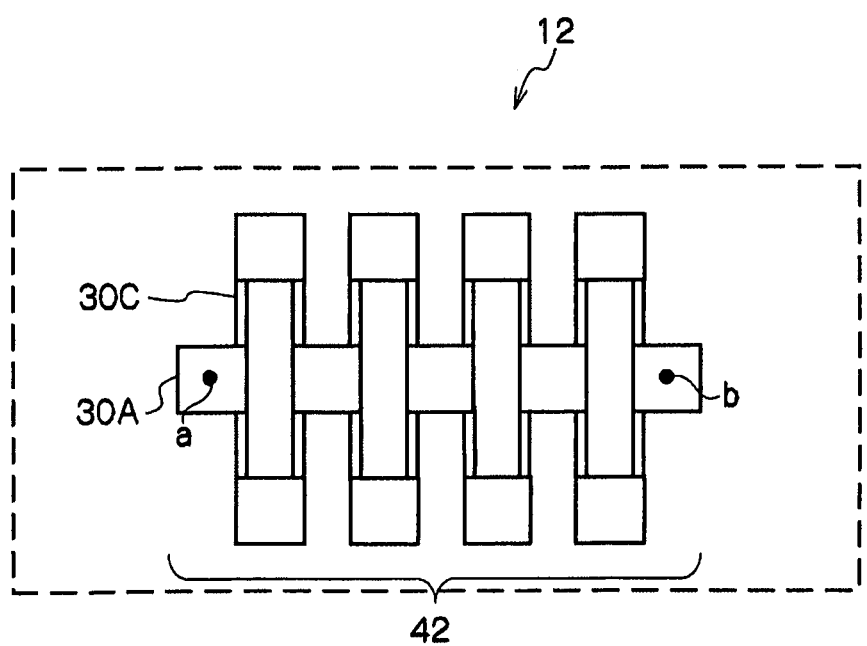
FIG. 23B is a schematic view showing a structure of a shifted EBG pattern according to another embodiment.
Figure 24A:
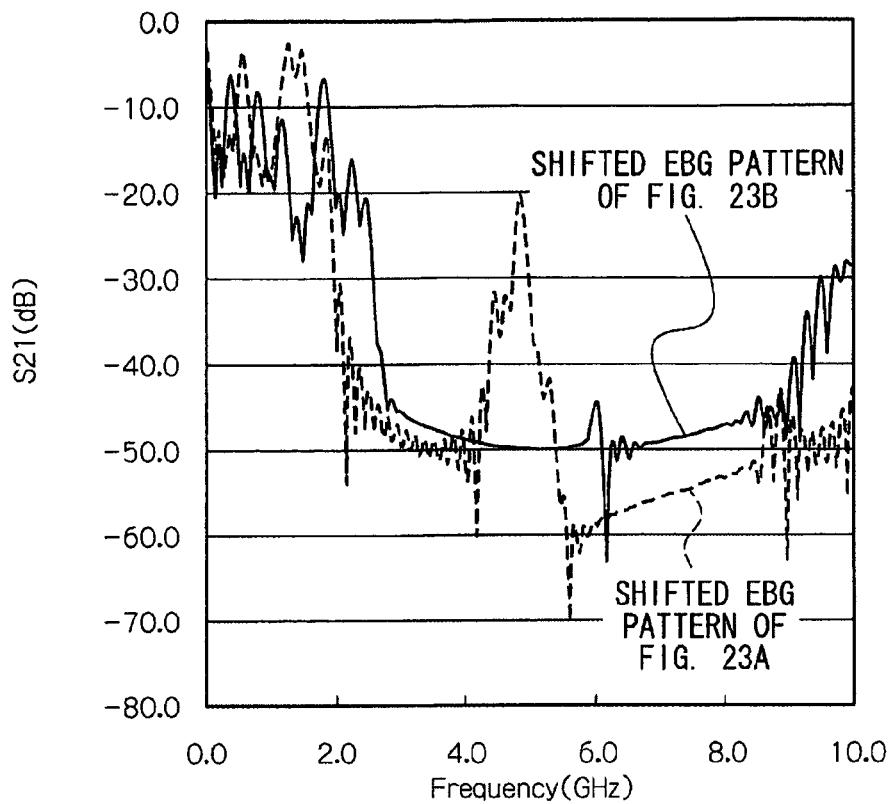
FIG. 24A is a graph showing another example of a measurement result of a variation in S21 with respect to frequency when a signal is propagated, for a shifted EBG pattern according to another embodiment.
Figure 24B:
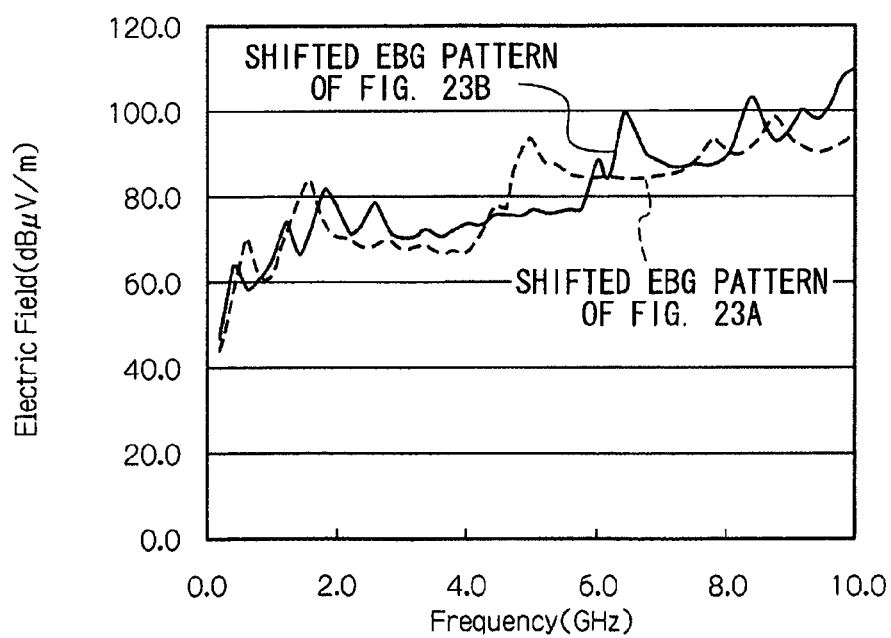
FIG. 24B is a graph showing another example of a measurement result of a variation in emitted electric field strength with respect to frequency when a signal is propagated, for a shifted EBG pattern according to another embodiment.

FIG. 24A shows an example of a variation in a measurement result of S21 with respect to frequency when a signal propagates from measurement point a to measurement point b for shifted EBG pattern 42 shown in FIG. 23A, and FIG. 24B shows a corresponding example of a variation in measurement result of emitted electric field strength with respect to frequency. FIGS. 24A and 24B also show an example of a variation in measurement result for shifted EBG pattern 42 shown in FIG. 23B, in which a conductive pattern 30A is connected to another conductive pattern 30A by a conductive pattern 30C in the y direction.

In each of the shifted EBG patterns 42 shown in FIGS. 23A and 23B, conductive patterns 30A have a square shape with sides of 8 mm, and conductive patterns 30C have a rectangular shape 7.5 mm long and 1 mm wide. Board 12 has a rectangular shape 92.5 mm long and 46 mm wide.

In FIGS. 24A and 24B, the solid line represents a measurement result for shifted EBG pattern 42 shown in FIG. 23B, and the dashed line represents a measurement result for shifted EBG pattern 42 shown in FIG. 23A.

As shown in FIG. 24A, the value of S21 for shifted EBG pattern 42 shown in FIG. 23A is substantially lower in the range of 6-9 GHz than the value of S21 for shifted EBG pattern 42 shown in FIG. 23B. Further, as shown in FIG. 24B, the emitted electric field strength value for shifted EBG pattern 42 shown in FIG. 23A is substantially lower at around 7 GHz than the emitted electric field strength value for shifted EBG pattern 42 shown in FIG. 23B.

What is claimed is:

1. A printed wiring board, comprising:
   a plurality of first conductive patterns arranged adjacently in a first direction and separated by first gaps;
   a plurality of conductive pattern rows comprising the plurality of first conductive patterns;
   a conductive pattern group comprising the plurality of conductive pattern rows arranged adjacently in a second direction that intersects the first direction and separated by third gaps; and
   a plurality of second conductive patterns which are smaller than the first conductive patterns, at least one of the second conductive patterns connecting one first conductive pattern located at one end of one conductive pattern row to one first conductive pattern adjacent thereto in the second direction, and further second conductive patterns connecting each of the other first conductive patterns which are in the same row as the one first conductive pattern to two other first conductive patterns adjacent thereto in the second direction, wherein
   the plurality of conductive pattern rows include a first row and a second row which are adjacent to each other,
   a first line that connects central points of each of the adjacent first conductive patterns which are included in the first row is not orthogonal to a second line that connects central points of each of the adjacent first conductive patterns which are included in the first row and the second row,
   each first conductive pattern includes a portion less than its whole that opposes an immediately adjacent first conductive pattern in the second direction, and
   when a conductive pattern row is located above another conductive pattern row, a leftmost position of the conductive pattern row is offset to the right of a leftmost position of a conductive pattern row that is located immediately beneath the offset conductive pattern row.

2. The printed wiring board of claim 1, wherein
   the plurality of first conductive patterns each have a square shape, a side of which faces the first direction, and the lengths of the first gaps are substantially equal to a length of a side of a first conductive pattern;
   the plurality of second conductive patterns have a rectangular shape with a length substantially equal to a side of a first conductive pattern.

3. A printed wiring board, comprising:
   a plurality of first conductive patterns arranged adjacently in a first direction and separated by first gaps;
   a plurality of conductive pattern rows comprising the plurality of first conductive patterns;
   a conductive pattern group comprising the plurality of conductive pattern rows arranged adjacently in a second direction that intersects the first direction and separated by third gaps;
   a plurality of second conductive patterns that connect, in the first direction, each of the plurality of first conductive patterns to first conductive patterns adjacent thereto in the first direction; and
   a plurality of third conductive patterns that are smaller than the first conductive patterns, and that connect each of the plurality of first conductive patterns to first conductive patterns adjacent thereto in the second direction, the plurality of third conductive patterns extending at an angle less than 90 degrees with respect to the second direction, wherein the plurality of conductive pattern rows include a first row and a second row which are adjacent to each other, a first line that connects central points of each of the adjacent first conductive patterns which are included in the first row is not orthogonal to a second line that connects central points of each of the adjacent first conductive patterns which are included in the first row and the second row, and the plurality of conductive pattern rows being shifted from each other in the first direction by a second gap, a length of the second gap in the first direction being longer than a diameter of a first conductive pattern in the first direction.

4. A printed wiring board, comprising:

a plurality of first conductive patterns arranged adjacently in a first direction and separated by first gaps;

a plurality of conductive pattern rows comprising the plurality of first conductive patterns;

a conductive pattern group comprising the plurality of conductive pattern rows arranged adjacently in a second direction that intersects the first direction and separated by third gaps; and a plurality of second conductive patterns which are smaller than the first conductive patterns that connect each of the plurality of first conductive patterns to first conductive patterns adjacent thereto in the second direction, the plurality of second conductive patterns extending at an angle less than 90 degrees with respect to the second direction, wherein the plurality of conductive pattern rows include a first row and a second row which are adjacent to each other, a first line that connects central points of each of adjacent first conductive patterns which are included in the first row is not orthogonal to a second line that connects central points of each of adjacent first conductive patterns which are included in the first row and the second row, and the plurality of conductive pattern rows being shifted from each other in the first direction by a second gap, a length of the second gap in the first direction being longer than a diameter of a first conductive pattern in the first direction.

5. A printed wiring board, comprising:

a plurality of first conductive patterns arranged adjacently in a first direction and separated by first gaps;

a plurality of conductive pattern rows comprising the plurality of first conductive patterns;

a conductive pattern group comprising the plurality of conductive pattern rows arranged adjacently in a second direction that intersects the first direction and separated by third gaps;

a plurality of second conductive patterns that are smaller than the first conductive patterns and that connect, in the first direction, each of the plurality of first conductive patterns to first conductive patterns adjacent thereto in the first direction; and a plurality of third conductive patterns that are smaller than the first conductive patterns, and that connect, in the second direction, each of the plurality of first conductive patterns to first conductive patterns adjacent thereto in the second direction, wherein the plurality of conductive pattern rows include a first row and a second row which are adjacent to each other, a first line that connects central points of each of adjacent first conductive patterns which are included in the first row is not orthogonal to a second line that connects central points of each of adjacent first conductive patterns which are included in the first row and the second row, each first conductive pattern includes a portion less than its whole that opposes an immediately adjacent first conductive pattern in the second direction, and each first conductive pattern in the first row is connected to exactly one first conductive pattern in the second row.

* * * * *